(12) United States Patent
Ito et al.

(10) Patent No.: US 7,886,438 B2
(45) Date of Patent: Feb. 15, 2011

(54) PROCESS FOR PRODUCING MULTILAYER PRINTED WIRING BOARD

(75) Inventors: Shoji Ito, Sakura (JP); Ryoichi Kishihara, Sakura (JP); Osamu Nakao, Sakura (JP); Hiroki Hashiba, Sakura (JP); Masahiro Okamoto, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/463,708

(22) Filed: May 11, 2009

(65) Prior Publication Data

US 2009/0217522 A1   Sep. 3, 2009

Related U.S. Application Data

(62) Division of application No. 10/542,649, filed as application No. PCT/JP03/16377 on Dec. 19, 2003, now abandoned.

(30) Foreign Application Priority Data

| Jan. 20, 2003 | (JP) | ............................. 2003-011635 |
| Aug. 19, 2003 | (JP) | ............................. 2003-294994 |
| Sep. 1, 2003 | (JP) | ............................. 2003-309254 |
| Oct. 1, 2003 | (JP) | ............................. 2003-342907 |

(51) Int. Cl.
*H01K 3/10* (2006.01)

(52) U.S. Cl. .............................. 29/852; 29/831; 29/849; 174/262

(58) Field of Classification Search ............ 29/829–831, 29/846, 848, 849, 851, 852, 412; 174/255, 174/262; 257/686; 438/109

See application file for complete search history.

(56) References Cited

U.S. PATENT DOCUMENTS

| 4,316,320 | A |  | 2/1982 | Nogawa et al. |
| 5,081,563 | A |  | 1/1992 | Feng et al. |
| 6,163,957 | A | * | 12/2000 | Jiang et al. ..................... 29/852 |
| 6,281,446 | B1 |  | 8/2001 | Sakamoto et al. |
| 6,608,371 | B2 | * | 8/2003 | Kurashima et al. .......... 257/686 |

FOREIGN PATENT DOCUMENTS

| EP | 1079677 A2 | 2/2001 |
| JP | 55-160452 A | 12/1980 |
| JP | 4-35092 A | 2/1992 |
| JP | 4-94186 A | 3/1992 |
| JP | 6-283836 A | 10/1994 |
| JP | 7-106728 A | 4/1995 |
| JP | 7-135375 A | 5/1995 |
| JP | 8-139454 A | 5/1996 |
| JP | 8-236937 A | 9/1996 |
| JP | 10-41635 A | 2/1998 |
| JP | 10-135595 A | 5/1998 |

(Continued)

*Primary Examiner*—Donghai D. Nguyen
(74) *Attorney, Agent, or Firm*—Sughrue Mion, PLLC

(57) ABSTRACT

At least one base material having a wiring circuit that has been formed into a predetermined outer shape is bonded to a motherboard. The motherboard wiring board and the base material having a wiring circuit are electrically connected to each other at least one portion through an inner via hole. The outer shape of the base material having a wiring circuit is smaller than the outer shape of the motherboard, with the base material having a wiring circuit having an island shape on the motherboard.

10 Claims, 29 Drawing Sheets

FOREIGN PATENT DOCUMENTS

| | | |
|---|---|---|
| JP | 2000-156564 A | 6/2000 |
| JP | 2000-183526 A | 6/2000 |
| JP | 2000-208667 A | 7/2000 |
| JP | 2001-24292 A | 1/2001 |
| JP | 2001-168481 A | 6/2001 |
| JP | 2001-298274 A | 10/2001 |
| JP | 2002-43506 A | 2/2002 |
| JP | 2002-64271 A | 2/2002 |
| JP | 2002-158445 A | 5/2002 |
| JP | 2002-171063 A | 6/2002 |
| JP | 2003-92473 A | 3/2003 |
| JP | 2003-229665 A | 8/2003 |
| JP | 2004-228165 A | 8/2004 |
| JP | 2003-294994 | 10/2005 |

* cited by examiner

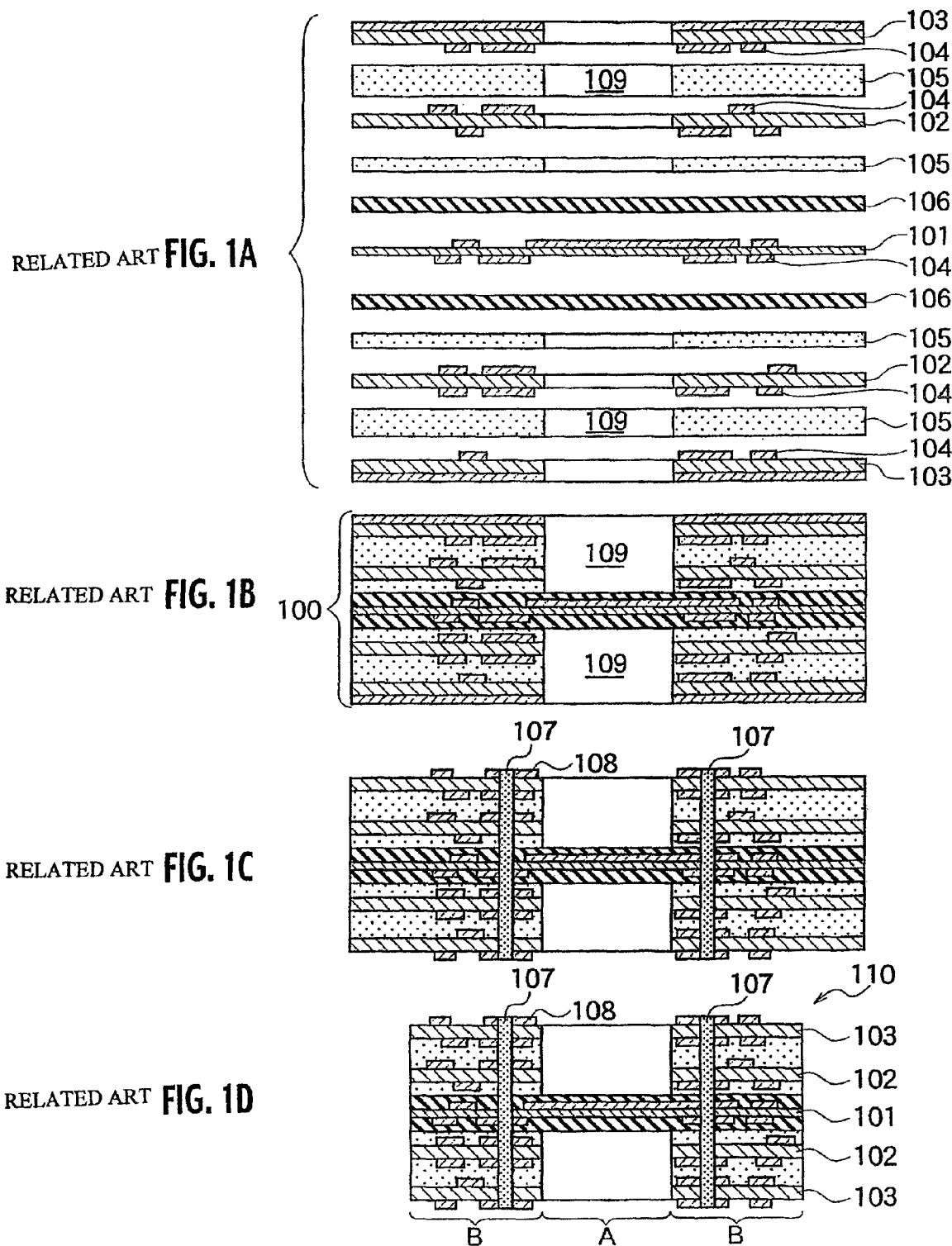

RELATED ART FIG. 2A
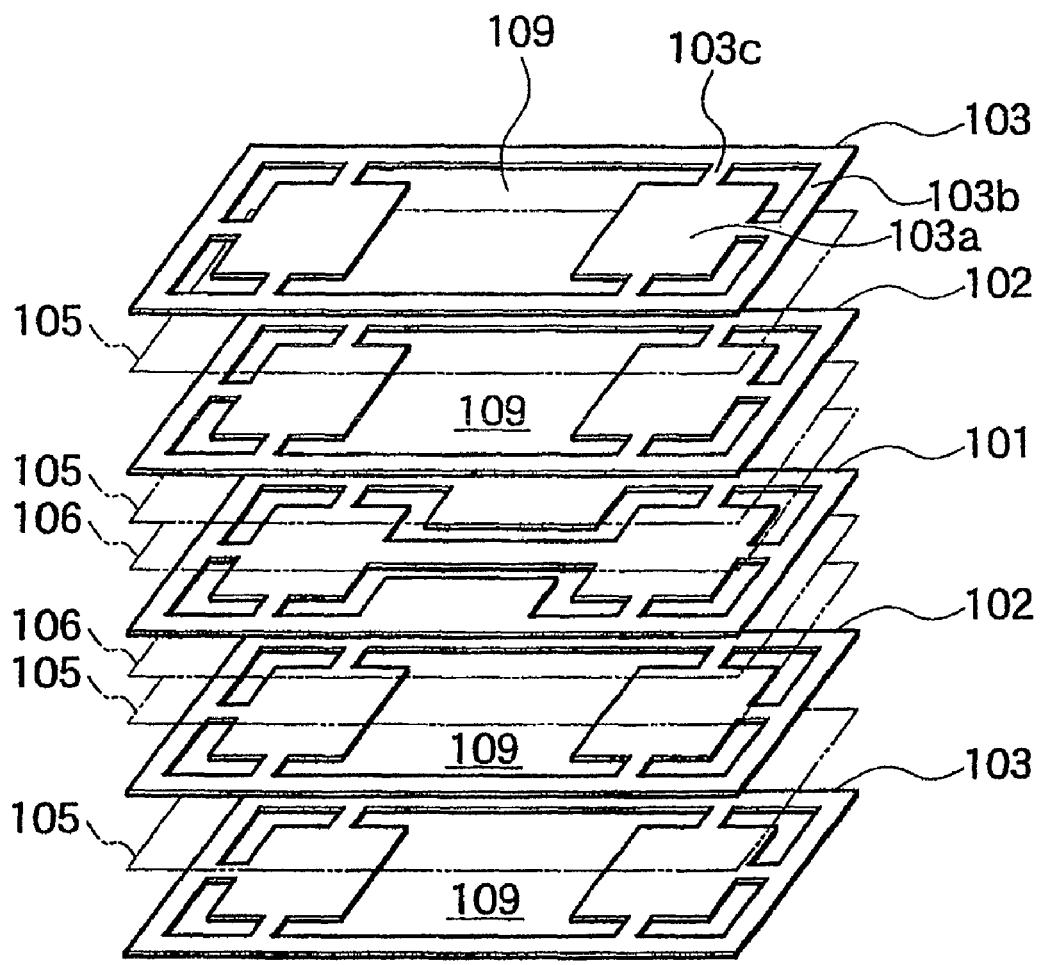
RELATED ART FIG. 2B
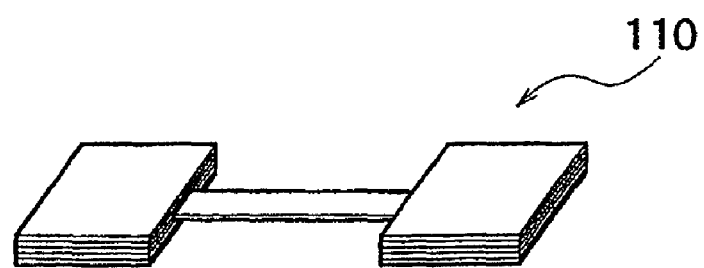

PROCESS FOR PRODUCING MULTILAYER PRINTED WIRING BOARD

This is a request for a Divisional Application of prior application Ser. No. 10/542,649, filed Jul. 19, 2005, now abandoned, which is a U.S. National Phase Application of International Application No. PCT/JP03/16377, filed Dec. 19, 2003, which claims priority to Japanese Patent Application Nos. JP 2003-11635, filed Jan. 20, 2003, 2003-294994, filed Aug. 19, 2003, 2003-309254, filed Sept. 1, 2003 and 2003-342907, filed Oct. 1, 2003. The entire disclosures of the prior applications, are considered part of the disclosure of the accompanying divisional application and are hereby incorporated by reference.

TECHNICAL FIELD

The present invention relates to a multi-layer wiring board and a method for manufacturing the same.

BACKGROUND ART

Recent electronic apparatuses have been made smaller and light weight in addition to developments in the applicability to high-frequency signals and digitized devices, and along with these developments, there have been demands for small-size devices, a high-density packaging property and the like in printed circuit boards being installed in the electronic apparatuses.

There is a rigid flex printed circuit board satisfying these demands which includes a rigid portion and a flex portion (for example, Japanese Patent Application Laid Open Publication No. 2002-158445).

With reference to FIGS. 1A to 2B, a manufacturing process of a conventional rigid flex printed circuit board will be described bellow. FIGS. 1A to 1D are flow charts that show manufacturing processes of the rigid flex printed circuit board. FIG. 2A is a perspective view that shows the substrate and the like shown in FIGS. 1A and 1B and FIG. 2B is a perspective view of a rigid flex wiring board shown in FIG. 1D.

As shown in FIG. 1A, wiring circuits 104 are formed by a subtractive method on both of the surfaces of a flex substrate 101 made of a polyimide film, both of the surfaces of an inner-layer rigid substrate 102 made from a prepreg and the like, and one surface of an outer layer rigid substrate 103.

Substantially, as shown in FIG. 1A and FIG. 2A, flex-portion exposing holes 109 are formed through a bonding sheet 105, the inner-layer rigid substrate 102 and the outer-layer rigid substrate 103, by using a press-punching process and the like. Next, a flex-substrate-use cover layer 106, the inner-layer rigid substrate 102, the bonding sheet 105 and the outer-layer rigid substrate 103 are superposed and placed on the surface and rear surface of the flex substrate 101, and subjected to a laminating process to prepare a laminated member 100 shown in FIG. 1B. In this case, as shown in FIG. 2A, a peripheral portion of a portion (for example, indicated by 103a) that forms a circuit board upon completion of the processes is punched out so that the portion (for example, 103a) to form the circuit board is joined to a frame member (for example, 103b) by using a micro-joint (for example, 103c).

Next, as shown in FIG. 1C, the laminated member 100 is subjected to a drilling process, a plating process and etching so that a through hole 107, an outer-layer wiring circuit 108 and the like are formed therein.

Lastly, the micro-joints (for example, 103c), which have joined a rigid portion B and a flex portion A to the frame member (for example, 103b), are simultaneously punched out by using a die so that a rigid flex printed circuit board 110, shown in FIGS. 1D and 2B, is obtained. In this case, the frame member (for example, 103b) for the substrates 101, 102 and 103 and portions that have been punched out so as to form the substrates 101 are disposed.

Moreover, those circuit boards having an arrangement in which a built-up layer is formed on the surface layer of the rigid flex printed circuit board, and interlayer-connected thereto through IVHS (Interstitial Via Holes) and SVHS (Surface Via Holes) have also been proposed.

DISCLOSURE OF INVENTION

However, according to the conventional rigid flex printed circuit board and the manufacturing method thereof, after the lamination of the rigid portion, the outer shapes of the rigid portion and the flex portion need to be simultaneously cut out (a cutting process). Therefore, it is necessary to use substrates having sufficient margin portions required for positioning processes for the respective substrates. Moreover, in most of cases, after the cutting process, these margin portions are disposed as the frame members. In other words, in the conventional rigid flex printed circuit board, since the rigid portion needs to be laminated at a predetermined position of the flex substrate, assembling processes of the rigid portions on the inner layer and outer layer rigid substrates, which are carried out so as to place the rigid portions at predetermined positions on the flex substrate when formed as laminated layers, are limited by factors such as an outer shape and positions of the flex substrate. In other words, even when an attempt is made so as to carry out a laminating process only on one portion of the flex substrate, it is necessary to prepare an assembling-use member that is as large as the flex substrate.

For this reason, excessive multi-layered areas exist on the rigid portion, causing wasteful material costs. Further, there is a limitation in positions in which multi-layered areas are placed, resulting in little design freedom for wiring.

The present invention has been devised to solve the above-mentioned problems, and the first objective thereof is to provide a multi-layer wiring board which provides higher design freedom for wiring, and makes it possible to cut material costs, and also to reduce the substrate capacity, and a manufacturing method for such a wiring board.

In order to achieve the above-mentioned objects, according to a first aspect of a multi-layer wiring board, wherein at least one base material with wiring circuit being preliminarily formed into a predetermined outer shape is bonded to a motherboard, and the base material on the motherboards are electrically connected to each other through at least an inner via hole.

Moreover, conventionally, when a substrate that includes a plurality of substrates with single-sided wiring circuits is bent, a separation tends to occur between the substrates due to inter-layer stress of the layers of the motherboard printed substrate and the substrate with single-sided wiring circuits or between the layers of the laminated substrates with single-sided wiring circuits.

Therefore, a second object of the present invention is to provide a multi-layer wiring board which has higher anti-bending strength (peel strength) as compared with the conventional substrate, and a manufacturing method for such a wiring board In order to achieve this objective, according to a second aspect of a multi-layer wiring board, wherein two or more substrates, each of which has been preliminarily formed into a predetermined outer shape with single-sided wiring circuit formed thereon, are laminated and bonded to a motherboard, and at least one inter-layer portion thereof is electrically connected through an inner via hole, and in this arrangement, the two or more laminated substrates, each with single-sided wiring circuit formed thereon, are positioned in a manner so as to place the outer shape of a second substrate bonded to the first substrate inside the outer shape of the first substrate being bonded to the motherboard side Moreover, in the case when a circuit substrate that allows double-sided assembling processes is formed by using the conventional manufacturing method, a double-sided circuit substrate is required as a core substrate. In the case, however, as described above, upon forming a conductive pattern, most of the conductive layer on one side needs to be removed, resulting in wasteful use of materials and resources. Another problem is that complex manufacturing processes are required to form through holes and the like.

Therefore, a third object of the present invention is to provide a circuit substrate that allows double-sided packaging processes so that electronic parts can be assembled on double sides by using a single-sided circuit substrate as a core substrate (main circuit substrate), that is, as a motherboard In order to achieve this object, according to a third aspect of a multi-layer wiring board, wherein at least one portion of an insulating base material of a main single-sided circuit substrate having a conductive pattern on one surface of the insulating substrate is partially removed so that the rear face of the conductive pattern is exposed at the removed portion, and from the other side of the insulating base material of the main single-sided circuit substrate, an electronic part is laminated with the main single-sided circuit substrate with the rear-face exposed portion of the conductive pattern of the main single-sided circuit substrate is electrically connect with the electrical part, and/or a single-sided circuit board for multi-layer wiring board having an interlayer conductive portion and a conductive pattern formed on one face of an insulating base material is laminated with the main single-sided circuit substrate with the rear-face exposed-portion of the conductive pattern is electrically connect with the single-sided circuit board for multi-layer wiring board.

Furthermore, the conventional printed wiring board that allows double-sided packaging processes uses a double-sided copper coat laminated plate (double-sided CCL) as a starting member for a relay board. In this technique, however, since plated through holes are used, time-consuming complex metal plating processes are required, and the thickness of a copper foil of the double-sided CCL tends to increase, causing the problem that it is difficult to form a fine pattern through chemical etching. Moreover, it is difficult to form a via hole to the upper layer or the like right above a through hole, and circuit designing is, ipso, restricted.

In order to solve this problem, a fourth object of the present invention is to provide a multi-layer wiring board that allows double-sided packaging processes so that electronic parts can be assembled on double sides by using a base material with single-sided circuit substrate formed thereon as a starting member for a relay board, and a manufacturing method for such a multi-layer wiring board In order to achieve this object, according to a fourth aspect of a multi-layer wiring board, a multi-layer wiring board having wiring board for partial multi-layers formed on a specific area in a relay board formed by a base material with single-sided wiring circuit, and the relay board has a conductive layer on one face of an insulating substrate, an interlayer connecting portion comprising a via hole formed on the insulating substrate and filled with a conductive substance, and an interlayer connecting portion comprising a via hole formed on the insulating resin layer, and wherein the multi-layer-use substrates are laminated on respective specific areas on the face on the side opposite to the conductive layer face of the insulating base material and the surface of the insulating resin layer with, in conductive-association with the relay board.

BRIEF DESCRIPTION OF DRAWINGS

FIGS. 1A to 1D are flow charts that show manufacturing processes of a conventional rigid flex printed wiring board.

FIG. 2A is a perspective view of FIGS. 1A and 1B.

FIG. 2B is a perspective view of the rigid flex printed wiring board shown in FIG. 1D.

BEST MODE FOR CARRYING OUT INVENTION

With reference to Figures, embodiments of the present invention will be described below.

First Embodiment

Figure 3:
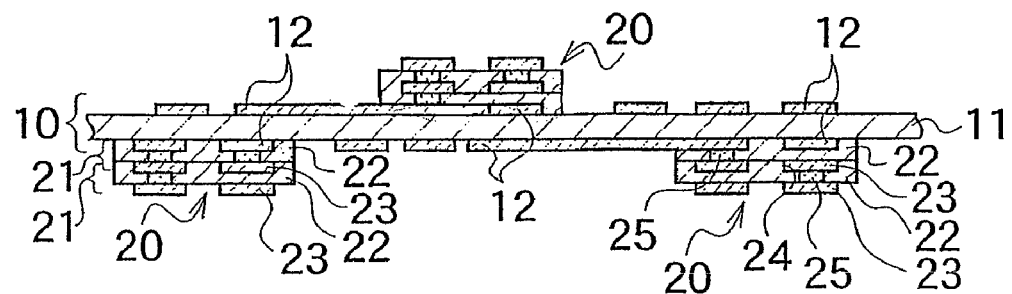
FIG. 3 is a cross-sectional view that shows a first embodiment of a multi-layer wiring board in accordance with the present invention.
Figure 4:
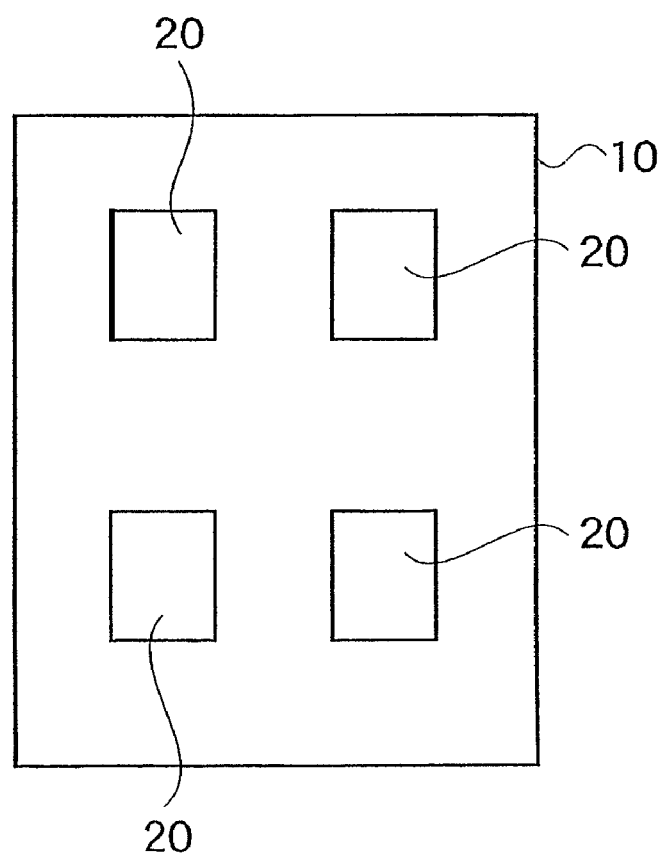
FIG. 4 is a plan view that shows the first embodiment of the multi-layer wiring board in accordance with the present invention.

FIGS. 3 and 4 show a basic mode of a multi-layer wiring board in accordance with a first embodiment of the present invention. In the multi-layer wiring board of the present embodiment, at a plurality of portions on the surface and rear surface of a motherboard (base material) 10, partial wiring boards (multi-layer portions) 20, which have outer shapes that have been preliminarily formed into predetermined shapes, and will be described later, are bonded so as to form an island shape. Here, the island shape is defined as a state in which the peripheral sides of the partial wiring boards 20 are not coincident with the peripheral sides of the motherboard 10 so that the partial wiring boards 20 are placed inside the area which is defined by the peripheral sides of the motherboard 10. Additionally, the predetermined shapes are determined on the request of designing the motherboard.

The partial wiring boards 20 are formed as follows: a plurality of resin base materials 21 with single-sided wiring circuits accordingly, which have outer shapes that have been formed into predetermined shapes that are smaller than the outer shape of the motherboard 10, are positioned on the surface and rear surface of the motherboard 10, and then colaminated. Here, the partial wiring boards 20 may include resin base materials with double-sided wiring circuits The motherboard 10 is provided with an insulating base material 11 and conductor layers (wiring circuits) 12 formed on the surface and rear surface of the insulating base material 11. The insulating base material 11 of the motherboard 10 is made from a flexible resin such as polyimide. Additionally, with respect to the flexible resin, other materials, such as liquid crystal polymer (LCP), polyether imide (PEI), polyether ether ketone (PEEK), polyethylene naphthalate (PEN), polyethylene terephthalate (PET) and polyether sulfone (PES), may be used. The resin base material 21 with single-sided wiring circuit is provided with an insulating base material 22, and a conductor layer (wiring circuit) 23 formed on one surface of the insulating base material 22. Besides rigid prepreg, the insulating base material 22 of the resin base material 21 with single-sided wiring circuit may be made from a flexible resin such as polyimide.

The conductor layers 23 of the resin base materials 21 with single-sided wiring circuits formed into a multi-layer structure, as well as the conductor layers 23 of the resin base materials 21 with single-sided wiring circuits and the conductor layer 12 of the motherboard 10, are electrically connected to each other by a conductor 25 being filled with conductive paste and the like coating inner via holes (via hole) 24 are respectively formed in the resin base materials 21 with single-sided wiring circuits.

The multi-layer wiring board is manufactured by layering the resin base materials 21 with single-sided wiring circuits that have outer shapes that have been formed into predetermined shapes to one portion of the surface and/or the rear surface of the motherboard 10. More specifically, a build-up method in which the resin base materials 21 with single-sided wiring circuits are bonded to one after another sheet by sheet may be used, however, a colamination method in which a plurality of resin base materials 21 with single-sided wiring circuits, each of which has a wiring circuit and a via hole formed thereon, and has an outer shape that has been formed into a predetermined shape, are superposed on the surface or one portion of the rear surface of the motherboard 10, and bonded to one after another by heating and pressing these through a batch process is more preferably used since it is a simpler method and can be achieved at low costs.

The mutual layering process between the resin base materials 21 with single-sided wiring circuits, the layering process between the resin base materials 21 with single-sided wiring circuits and the motherboard 10 can be carried out by a layering layer (not shown) being formed on an overside opposite to the conductor layer 23 of the insulating base material 22 of each of the resin base materials 21 with single-sided wiring circuits. In the case when the insulating base material 22 of each of the resin base materials 21 with single-sided wiring circuits is made from a material having an adhesive property, such as thermoplastic polyimide, thermoplastic polyimide to which a thermosetting property is imparted or liquid crystal polymer, the above-mentioned layering layer can be omitted.

With these arrangements, electronic-component-packaging-use multi-layer-forming portions (partial wiring boards 20) can be freely placed on desired positions on the surface of the motherboard 10, and it becomes possible to reduce excessive multi-layer-forming portions, and consequently to greatly cut the material costs.

In particular, in the case when the electronic-part packaging portions are made from an expensive material such as polyimide in response to requirements such as better dielectric properties, light weight and thinness, the above-mentioned arrangements exert greater effects.

Moreover, in the above-mentioned substrate structures, the insulating layer (insulating base material 22) of the partial wiring board 20 performing as an electronic part packaging portion and the insulating layer (insulating base material 11) of a flex portion (motherboard 10) are preferably made from the same material so that the thermal and mechanical properties of the two layers are made coincident with each other, and therefore, it becomes possible to provide high reliability in thermal and mechanical properties.

Figure 5:
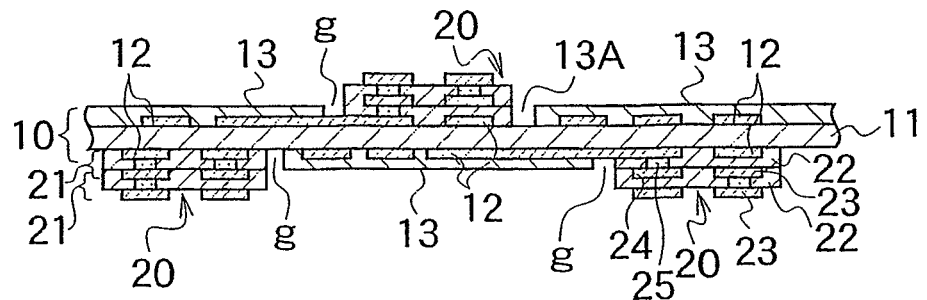
FIG. 5 is a cross-sectional view that shows a modified example of the first embodiment of the multi-layer wiring board in accordance with the present invention.

In general, the motherboard 10 is coated with a cover layer or a solder resist to protect the conductor layer. With respect to the covering layer of the motherboard 10, an opening portion is preliminarily formed at a portion on which multiple layers are formed by the resin base materials 21 with single-sided wiring circuits, and the resin base materials 21 with single-sided wiring circuits may be bonded onto this opening portion. In this case, as shown in FIG. 5, in the opening portion 13A, a gap g is formed between the multi-layer portion (installed portion of partial wiring boards 20) and the covering layer 13. And in this gap g portion, the conductor layer 12 is exposed (externally exposed state).

Figure 6:
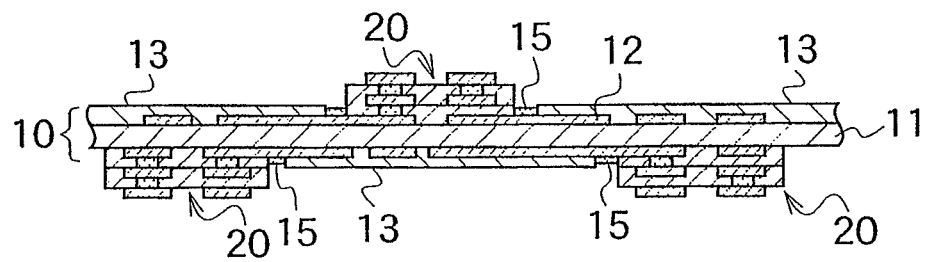
FIG. 6 is a cross-sectional view that shows a modified example of the first embodiment of the multi-layer wiring board in accordance with the present invention.
Figure 7:
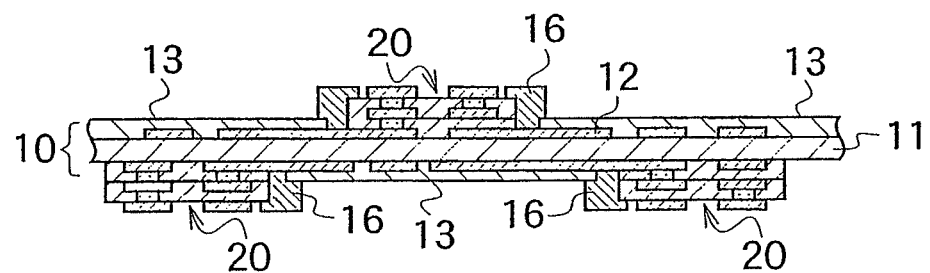
FIG. 7 is a cross-sectional view that shows a modified example of the first embodiment of the multi-layer wiring board in accordance with the present invention.

Therefore, in this case, the exposed portion is coated with noble metal 15 such as gold as shown in FIG. 6 to prevent oxidation, or as shown in FIG. 7, this portion is preferably coated with a covering layer 16 made from solder resist or the like.

Figure 8:
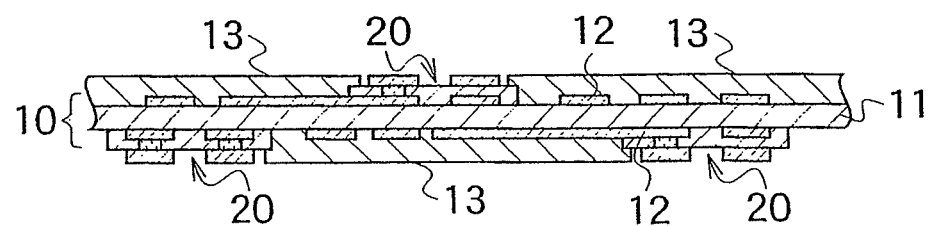
FIG. 8 is a cross-sectional view that shows a modified example of the first embodiment of the multi-layer wiring board in accordance with the present invention.

Moreover, as shown in FIG. 8, after the layering processes of the multi-layer portions, the covering layer 16 is formed, the covering layer 16 coats one portion of the motherboard 10 and the multi-layer portions, thus, for example, in the case when the motherboard wiring board is flexible, even at the time of bending, it is possible to prevent separation occurring on the interface between the multi-layer portions and the bending portion.

Figure 9:
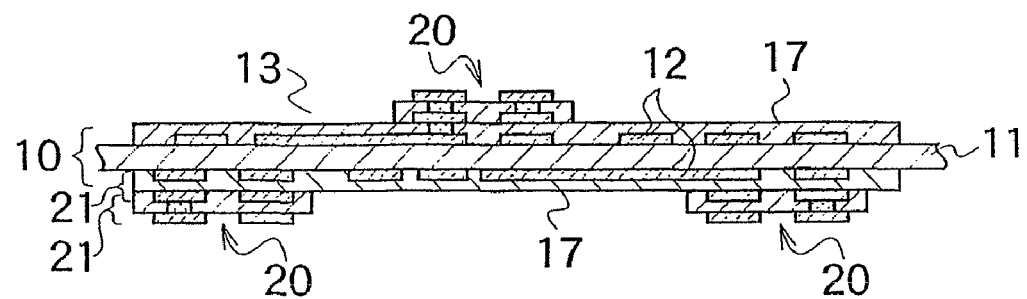
FIG. 9 is a cross-sectional view that shows a modified example of the first embodiment of the multi-layer wiring board in accordance with the present invention.

Furthermore, in an attempt to simplify processes, as shown in FIG. 9, this is achieved by integrally molding the cover layer of the motherboard 10 and the insulating layer of each resin base material 21 with single-sided wiring circuit that is made in contact with the motherboard 10 and bonded thereto from above. More specifically, the insulating layer of the resin base material 21 with single-sided wiring circuit and the cover layer of the motherboard 20 are made of the same insulating layer 17, and these are bonded to the motherboard 10.

Figure 10:
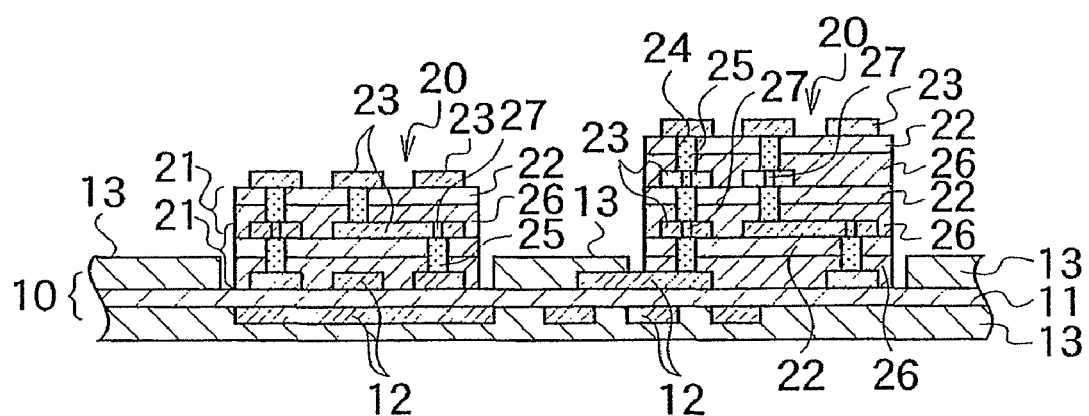
FIG. 10 is a cross-sectional view that shows a modified example of the first embodiment of the multi-layer wiring board in accordance with the present invention.

Moreover, the inner via hole 24 having a structure as shown in FIG. 10 is used as a conductive paste inner hole and an air-releasing pore 27 having a diameter smaller than that of the resin substrate portion is formed through the conductor layer 23 portion of the resin base material 21 with single-sided wiring circuit so that it is possible to prevent residual void at the time of injecting conductive paste. The conductive paste is also injected into the pore 27 to prevent the pore 27 from forming a void. Additionally, in FIG. 10, reference numeral 26 indicates an adhesive layer.

Next, with reference to FIGS. 11A to 11F, a manufacturing method for the resin base materials with single-sided wiring circuits that constitute the multi-layer wiring board will be described below, in detail. Different from the conventional substrate, the resin base material with single-sided wiring circuit of the present embodiment is not limited by the outer shape (formation position of the partial multi-layer substrates) of the motherboard, and therefore, the resin base plates with single-sided wiring circuits that have the same shape or different shapes can be formed onto the original base plate over a maximum area.

Figure 11A:
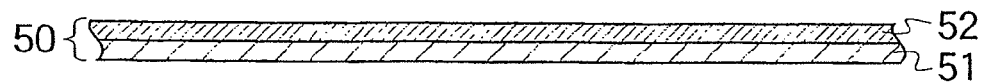
FIGS. 11A to 11F are flow charts that show a manufacturing method for a resin base material with single-sided wiring circuit, which is used for a multi-layer wiring board in accordance with the first embodiment of the present invention.
Figure 11B:
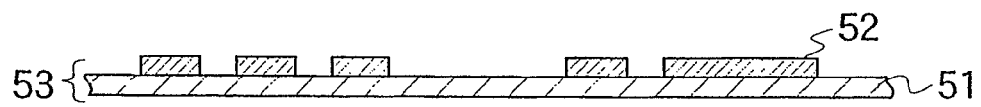

By using a polyimide base material 50 with single-sided copper foil 52 placed on one surface of a polyimide base material 51 as shown in FIG. 11A as a starting material, the copper foil 52 is etched through a subtractive method so that a base material 53 on which a circuit has been formed as shown in FIG. 11B is prepared. This base material may of course be obtained by using a polyimide base material without copper foil as a starting material, through an additive method or a semi-additive method.

Figure 11C:
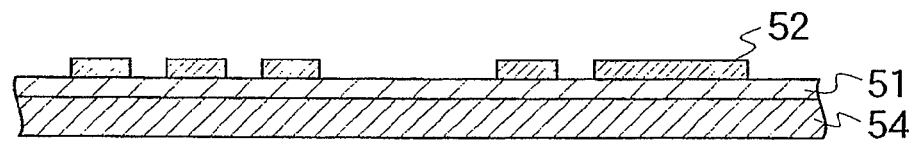

Next, as shown in FIG. 11C, an adhesive layer 54 is formed on a surface of the base material 53 with the circuit formed thereon on the overside to the copper foil 52 Although a layer made of a thermoplastic polyimide to which a thermo-setting property is imparted is used for the adhesive layer 54. Adhesive layer 54 may of course be made of a thermosetting resin typically represented by epoxy or a thermoplastic resin such as thermoplastic polyimide.

Here, the three-layer structure of the copper foil 52, the polyimide base material 51 and the adhesive layer 54 has an asymmetrical structure with respect to the surface and the rear surface thereof so that it is preferable to prevent undesired warping from occurring in the succeeding processes after the formation of the layering layer. Moreover, the adhesive layer 54 is preferably set to have a glass transition temperature of not more than 110° C. and a normal-temperature elastic modulus of not more than 1300 MPa.

Figure 11D:
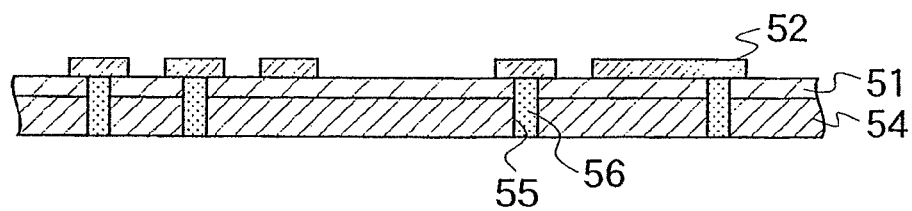

Next, as shown in FIG. 11D, after a hole-forming process (via-hole forming process) has been carried out with a UV- YAG laser beam so as to penetrate the adhesive layer 54 and the polyimide base material 51, a desmear process is carried out by soft etching through plasma irradiation so that the hole 55 is filled with hole-filling-use silver paste 56 to form an IVH.

Here, when a carbon dioxide laser, by using an excimer laser or the like, it becomes possible to carry out the processes at higher speeds. Moreover, with respect to the desmear method, a wet desmear process using permanganate is also generally used.

With respect to the IVH filling conductive paste, in addition to silver paste, various metal pastes, such as copper paste, carbon paste and nickel paste, may be used.

Figure 11E:
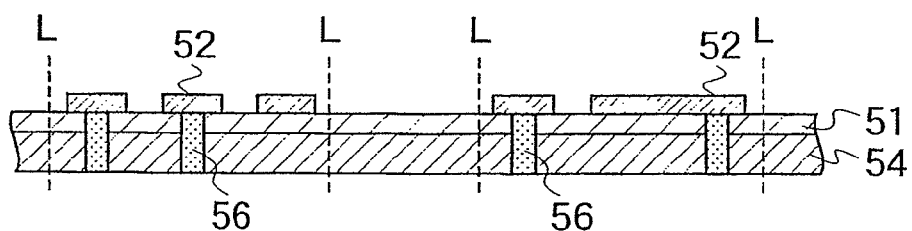
Figure 11F:
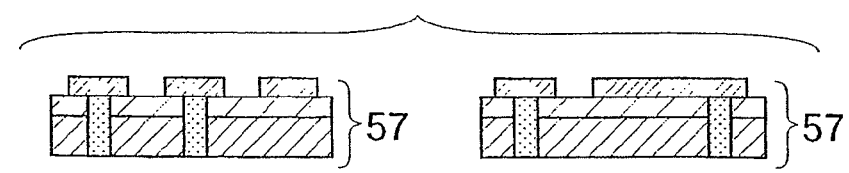

Next, as shown in FIG. 11E, a press working is applied along a dot line L using a die so that an outer-shape machining process is carried to form a predetermined shape. Thus, a resin base material 57 with single-sided wiring circuit as shown in FIG. 11F is formed through the outer-shape machining process. In this case, in order to prevent the IVH from being damaged by the conductive paste 56, it is necessary to provisionally cure the conductive paste 56 to a degree so as not to cause any damage upon contact. More specifically, the conductive paste 56 is preferably cured to have a hardness of not less than 2B on the basis of pencil hardness. Since the resin base material 57 with single-sided wiring circuit of this type can be formed without being limited by the outer shape of the motherboard 20, it becomes possible to reduce members to be eliminated.

Figure 12A:
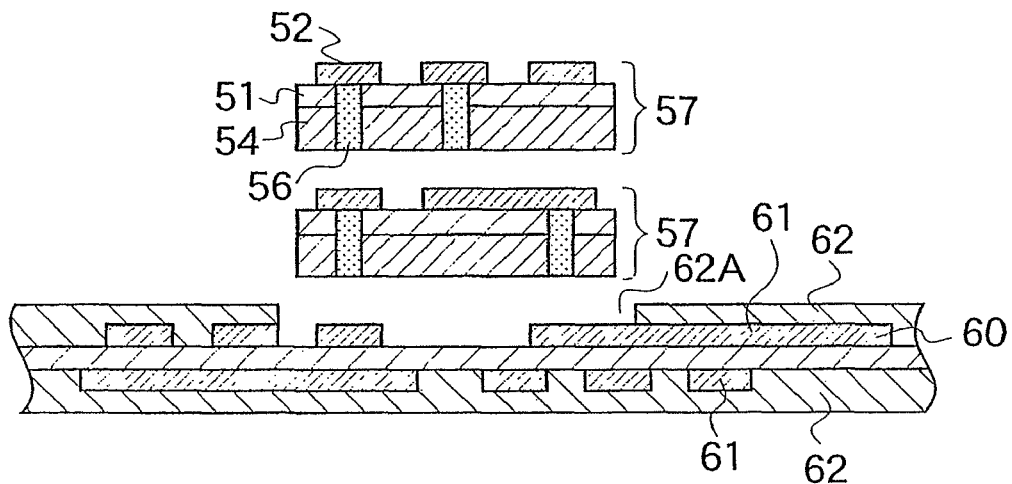
FIGS. 12A to 12C are flow charts that show a manufacturing method for the multi-layer wiring board in accordance with the first embodiment of the present invention.
Figure 12B:
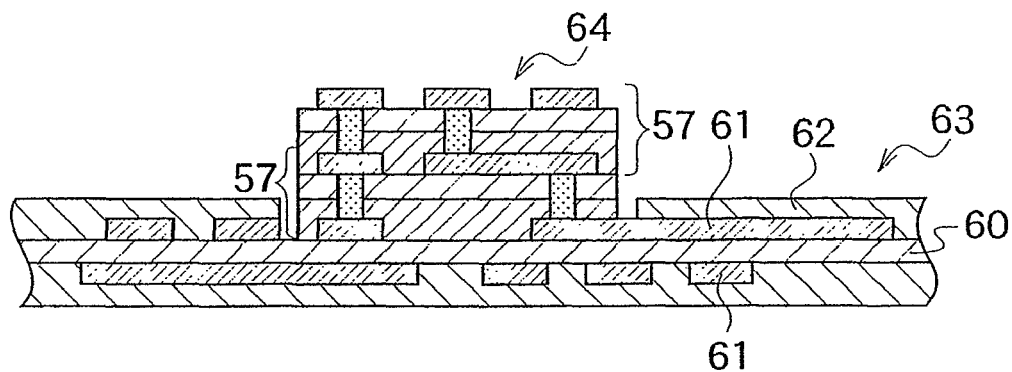
Figure 12C:
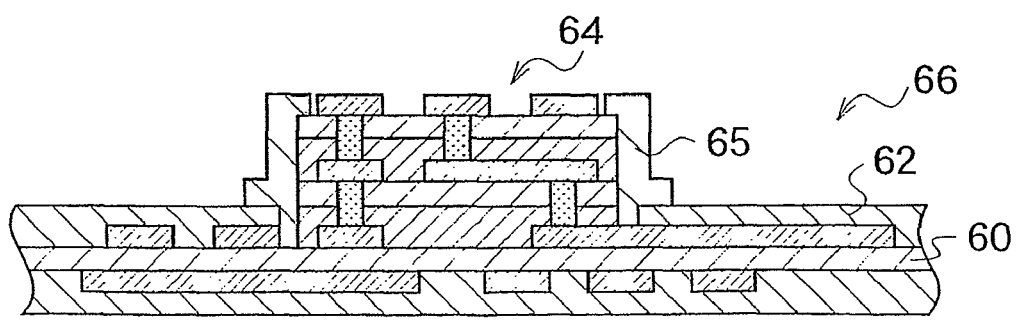

Referring to FIGS. 12A to 12C, manufacturing methods for various multi-layer boards by using the resin base material 57 with single-sided wiring circuit and the motherboard produced through the above-mentioned manufacturing processes will be described below.

As shown in FIG. 12A, a motherboard FPC 60 has a wiring circuit 61 formed thereon and is provided with a cover layer 62 with an opening (opening portion 62A) formed at a portion to receive laminated layers being formed on the surface thereof. Two resin base materials 57 with single-sided wiring circuit having conductive paste 56 and being formed into a predetermined shape are positioned to electrically conduct the conductor layer of the motherboard or the conductor layer of the resin base material 57 with single-sided wiring circuit one another, and then superposed one another.

Thereafter, these members are subjected to heating and pressing processes with a vacuum heat pressing machine under a degree of vacuum of not more than 1 kPa so that a substrate 63 containing a Iti-1a er portion 64 as shown in FIG. 12B is formed.

Here, upon carrying out the batch laminating processes, the resin base materials 57 with single-sided wiring circuits have an outer shape that has been formed into a predetermined shape may be laminated on the motherboard sheet by sheet, or after a plurality of the resin base materials 57 with single-sided wiring circuits have been preliminarily laminated, the laminated substrates may be placed on the motherboard through the batch process.

The positioning process may be carried out through a pin alignment method or an image recognition method. However, since the pin alignment method requires a space used for forming a pin hole, the positioning process using the image recognition is preferably adopted.

Next, as shown in FIG. 12C, solder resist 65 is applied onto the substrate 63 so as to cover a gap between the cover layer 62 and the multi-layer portion 64 of the motherboard FPC 60 as well as one portion of the surface of the multi-layer portion 64 and one portion of the surface of the cover layer 62, by using a print method, and then cured to form a multi-layer wiring board 66 First Embodiment-First Modified Embodiment.

Figure 13A:
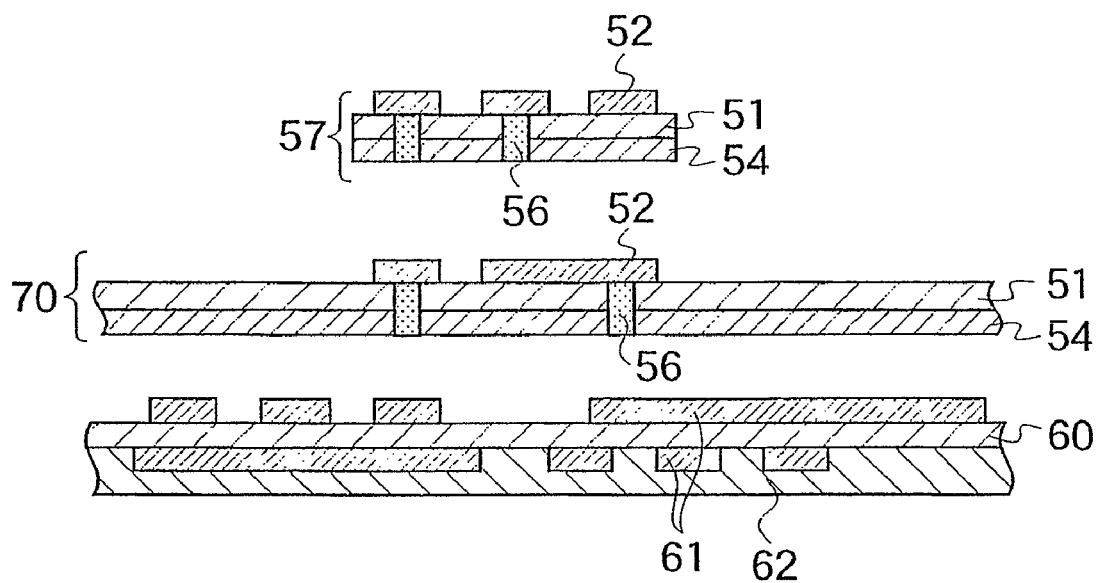
FIGS. 13A and 13B are flow charts that show a manufacturing method for a multi-layer wiring board in accordance with a modified example of the first embodiment.
Figure 13B:
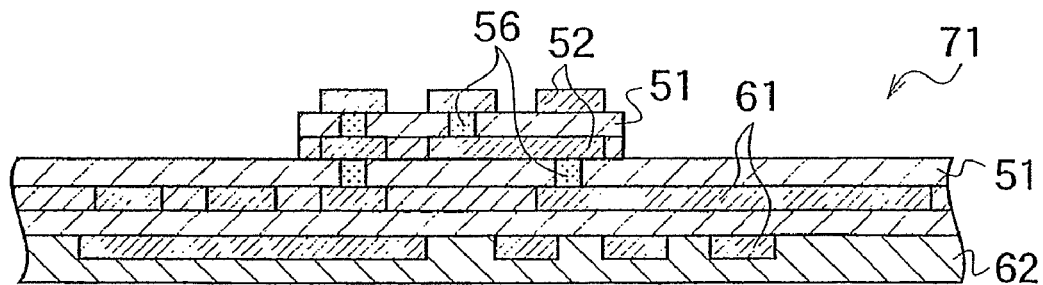

With reference to FIGS. 13A and 13B, a manufacturing method for a multi-layer wiring board in accordance with a first modified embodiment of the first embodiment will be described below. Here, in FIG. 13, those parts corresponding to those shown in FIG. 12 are indicated by the same reference numerals as those of FIG. 12, and the description thereof is omitted.

As shown in FIG. 13A, a motherboard FPC 60 has a wiring circuit 61 formed thereon, two resin base materials 57 and 70 with single-sided wiring circuits having conductive paste 56 that have been manufactured by the same method as shown in FIG. 11 are positioned to electrically connect the conductor layer of the motherboard or the conductor layer of the resin base material 57 with single-sided wiring circuit one another, and then superposed thereon. The resin base material 70 with a single-sided wiring circuit, which is made in contact with the circuit face of the motherboard FPC 60, has such an outer shape that its insulating layer (polyimide base material 51) is allowed to cover a portion to be covered with the cover layer, such as the copper foil portion of the motherboard FPC 60. Thus, the insulating layer of the resin base material 70 is also performed as the cover layer.

With respect to the positioning process in the modified example also, the positioning process using the image recognition is preferably adopted.

After the positioning process, these members are subjected to heating and pressing processes by a vacuum heat pressing machine under a degree of vacuum of not more than 1kPa so that a substrate 71 as shown in FIG. 13B is formed. In accordance with this method, upon heat pressing, a step difference is formed between the resin base materials 57 and 70 with single-sided wiring circuits so that it is preferable to prepare a cushioning structure for compensating for the step difference.

First Embodiment-Second Modified Embodiment

Referring to FIGS. 14A to 14E, a manufacturing method for a multi-layer wiring board in accordance with a second modified embodiment of the first embodiment will be described below. Here, in FIG. 14 also, those parts corresponding to those shown in FIG. 12 are indicated by the same reference numerals as those of FIG. 12 and the description thereof is omitted.

Figure 14A:
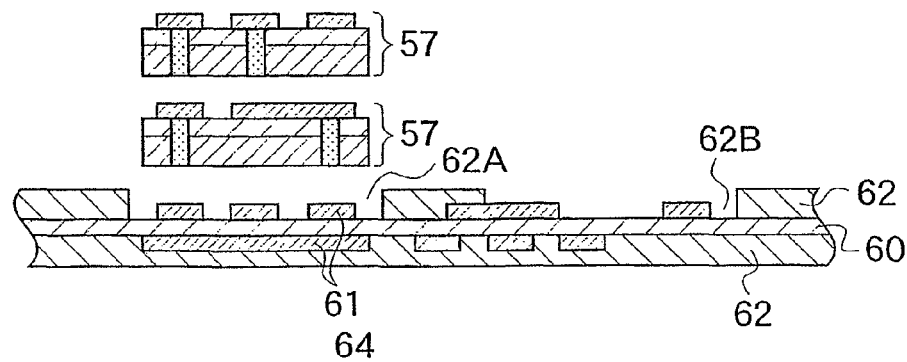
FIGS. 14A to 14E are flow charts that show a manufacturing method for a multi-layer wiring board in accordance with another modified example of the first embodiment.
Figure 14B:
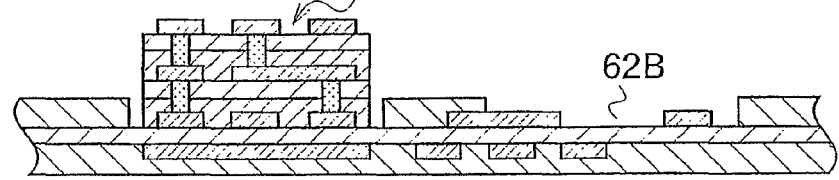

As shown in FIG. 14A, a motherboard FPC 60 has a wiring circuit 61 formed thereon and is provided with a cover layer 62 with openings (opening sections 62A and 62B) formed at portions to receive laminated layers that is formed on the surface thereof. Two layers of resin base materials 57 with single-sided wiring circuits that have an outer shape that has been formed into a predetermined shape, as shown in FIG. 9, are positioned, and then superposed thereon. Thereafter, these members are subjected to heating and pressing processes by a vacuum heat pressing machine under a degree of vacuum of not more than 1kPa so that a first multi-layer portion 64 as shown in FIG. 14B is formed.

Figure 14C:
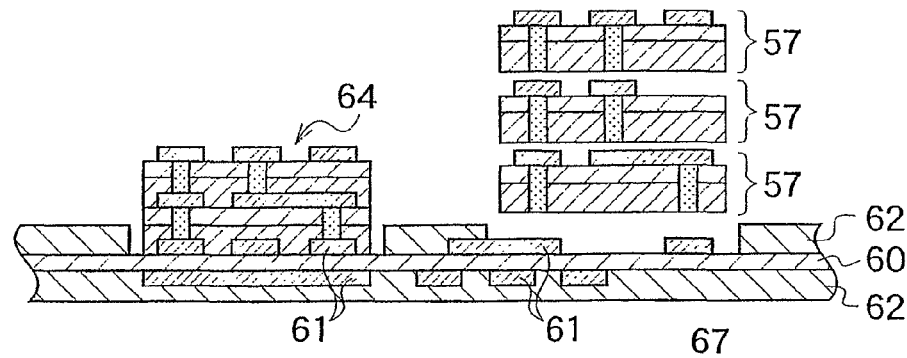
Figure 14D:
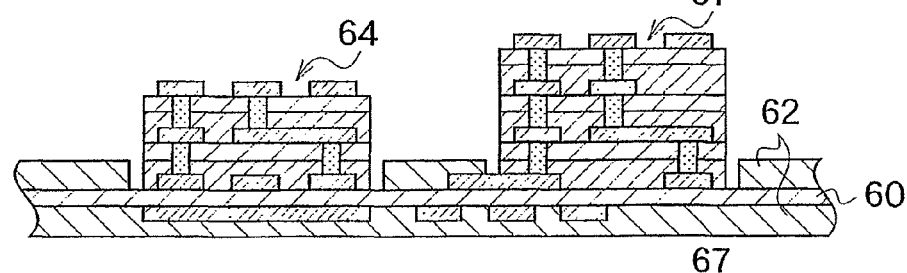

As shown in FIG. 14C, onto the other opening section 62B of the motherboard FPC 60, three layers of resin base materials 57 with single-sided wiring circuits that have an outer shape that has been formed into a predetermined shape are positioned accordingly, and then superposed thereon. Thereafter, these members are subjected to heating and pressing processes by a vacuum heat pressing machine under a degree of vacuum of not more than 1 kPa so that a second multi-layer portion 67 as shown in FIG. 14D is formed.

Figure 14E:
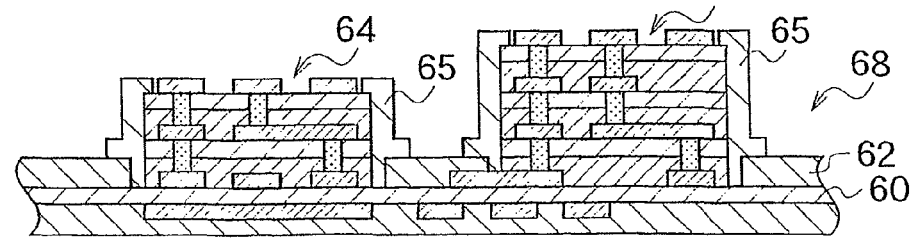

Next, as shown in FIG. 14E, solder resist 65 is applied thereto so as to cover gaps between the cover layer 62 and the multi-layer portions 64, 67 of the motherboard FPC 60 as well as one portion of the surface of each of the multi-layer portions 64, 67 and one portion of the surface of the cover layer 62, by using a print method, and then cured to form a multi-layer wiring board 68.

In this manner, in accordance with the manufacturing method for the multi-layer substrate of the first embodiment, it is possible to form a circuit that has a multi-layer portion having a desired thickness at a desired position. Here, with respect to the resin base material with single-sided wiring circuit, those having a conductor layer with a thickness of approximately 8 to 18 μm and an insulating base material with a thickness of 25 to 100 μm are generally used.

Second Embodiment

With reference to attached Figures, a second embodiment of the present invention will be described below.

Figure 15:
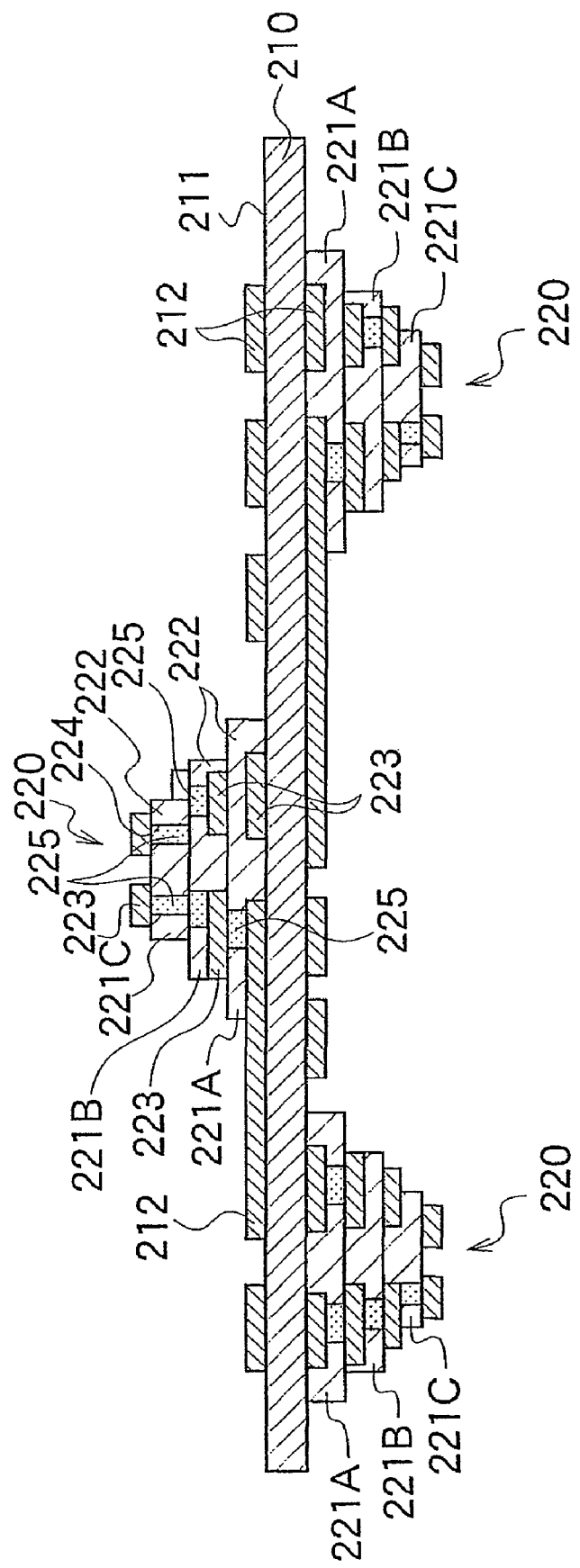
FIG. 15 is a cross-sectional view that shows a multi-layer wiring board in accordance with a second embodiment of the present invention.
Figure 16:
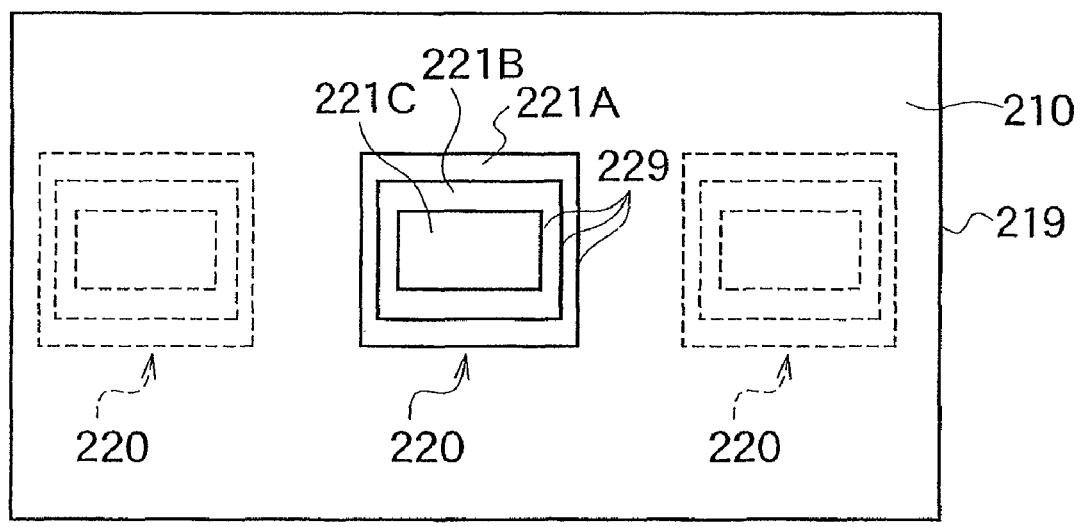
FIG. 16 is a plan view that shows the multi-layer wiring board in accordance with the second embodiment of the present invention.

FIGS. 15 and 16 show a second embodiment of a multi-layer wiring board in accordance with the present invention.

In the multi-layer wiring board of the present embodiment, at a plurality of portions on the surface and rear surface of a motherboard (base material) 210, partial wiring boards (multi-layer portions) 220, which have outer shapes that have been preliminarily formed into predetermined shapes, are bonded so as to form an island shape. Here, the island shape is defined as a state in which the peripheral sides of the partial wiring boards 220 are not coincident with the peripheral sides of the motherboard 210 so that the partial wiring boards 220 are placed inside the area determined by the peripheral sides of the motherboard 210. Here, the predetermined shapes are determined by requirements in designing the motherboard.

The partial wiring boards 220 are formed as follows: a plurality of resin base materials 221A, 221B and 221C with single-sided wiring circuits accordingly, which have outer shapes that have been formed into predetermined shapes that are smaller than the outer shape of the motherboard 210, are laminated on the surface and rear surface of the motherboard 210 in succession through a batch process.

As shown in FIG. 15, the resin base materials 221A, 221B and 221C have been formed into predetermined shapes so as to have decreasing its areas in succession, and therefore, when superposed one after another, the laminated resin substrates 221A, 221B and 221C virtually have a pyramid shape in the cross-section thereof.

In other words, the following relationship is satisfied: (area of resin base material 221A)>(area of resin base material 221B)>(area of resin base material 221C). More specifically, as shown in FIG. 16, when viewed from the normal line of the plane of the motherboard printed substrate 220, the outer shape of the resin base material 221B or the outside contour thereof is located inside the outer shape of the resin base material 221A or the outside contour thereof, and the outer shape of the resin base material 221C or the outside contour thereof is located inside the outer shape of the resin base material 221B or the outside contour thereof. In other words, those shapes are formed in such a manner that, when the centers of gravity of the respective resin base materials 221A, 221B and 221C are made coincident with one another, the outer sides 229 of the resin base material 221A are not coincident with each other. In the same manner, as shown in FIG. 16, when the centers of gravity of the respective resin base materials 221A, 221B and 221C are made coincident with one another, the outer sides 229 of the resin substrate 221A are not made coincident with the outer sides 219 of the motherboard 10.

The motherboard 210 is provided with conductor layers (wiring circuits) 212 formed on the surface and rear surface of an insulating base material 211. The insulating base material 211 of the motherboard 210 is made from a flexible resin such as polyimide. Additionally, with respect to the flexible resin, other materials, such as liquid crystal polymer (LCP), polyether imide (PEI), polyether ether ketone (PEEK), polyethylene naphthalate (PEN), polyethylene terephthalate (PET) and polyether sulfone (PES), may be used. Each of the resin base materials 221A, 221B and 221C with respective single-sided wiring circuits is provided with a conductor layer (wiring circuit) 223 formed on one surface of an insulating base material 222. The insulating base material 222 of each of the resin base materials 221 with single-sided wiring circuits may also be made from a flexible resin such as polyimide. The insulating base material 211 of the motherboard 210 and the insulating base material 223 of each of the resin base materials 221A, 221B and 221C with single-sided wiring circuits are preferably made from the same material such as polyimide from the viewpoints of thermal and mechanical influences.

The conductor layers 223 of the resin base materials 221A, 221B and 221C with single-sided wiring circuits, as well as the conductor layers 223 of the resin base materials 221 with single-sided wiring circuits and the conductor layer 212 of the motherboard 210, are electrically connected to each other by conductive paste 225 being filled in inner via holes (via holes) 224 respectively formed in the resin base materials 221 with respective single-sided wiring circuits.

This multi-layer wiring board in accordance with the second embodiment is manufactured by layering the resin base materials 221A, 221B and 221C with single-sided wiring circuits that have outer shapes that have been formed into predetermined shapes to one portion of the surface and/or the rear surface of the motherboard 210. More specifically, a build-up method in which the resin base materials 221 with single-sided wiring circuits are bonded to one after another sheet by sheet or a colamination method may be used. Here, the colamination method, which has an arrangement in which the resin base materials 221A, 221B and 221C with respective single-sided wiring circuits, each of which has a wiring circuit and a via hole formed thereon, and has an outer shape that has been formed into a predetermined shape, are superposed on one portion of the surface and/or the rear surface of the motherboard 210, and bonded to one after another by heating and pressing these through a batch process, is more preferably used since it is a simpler method and can be achieved at low costs. Additionally, the batch laminating process can be executed, after resin base materials with single-sided wiring circuits having an outer shape that has been formed into a predetermined shape have been laminated on the motherboard sheet by sheet, or it can be executed after a plurality of the resin base materials with single-sided wiring circuits have been preliminarily laminated, and placed on the motherboard.

The mutual layering processes between the resin base materials 221A, 221B and 221C with single-sided wiring circuits and the layering processes between the resin base materials 221A, 221B and 221C with single-sided wiring circuits and the motherboard 210 can be carried out by forming a layering layer (not shown) on a surface on the side opposite to the conductor layer 223 of the insulating base material 222 of each of the resin base materials 221A, 221B and 221C with single-sided wiring circuits and by using this layering layer.

In the case when the insulating base material 222 of each of the resin base materials 221A, 221B and 221C with single-sided wiring circuits is made from a material having an adhesive property, such as thermoplastic polyimide, thermoplastic polyimide to which a thermosetting property is imparted or liquid crystal polymer, the above-mentioned layering layer can be omitted.

With these arrangements, electronic-component-packaging-use multi-layer-forming portions (partial wiring boards 220) can be freely placed on desired positions on the surface of the motherboard 210, and it becomes possible to reduce excessive multi-layer-forming portions, and consequently to greatly cut the material costs.

In particular, in the case when the electronic-part packaging portions are made from an expensive material such as polyimide in response to requirements such as better dielectric properties, light weight and thinness, the above-mentioned arrangements exert greater effects.

Moreover, in the above-mentioned substrate structures, the insulating layer (insulating base material 222) of the partial wiring board 220 performing as an electronic part packaging portion and the insulating layer (insulating base material 211) of a flex portion (motherboard 210) are preferably made from the same material so that the thermal and mechanical properties of the two layers are made coincident with each other, and therefore, it becomes possible to provide high reliability in thermal and mechanical properties.

Figure 17:
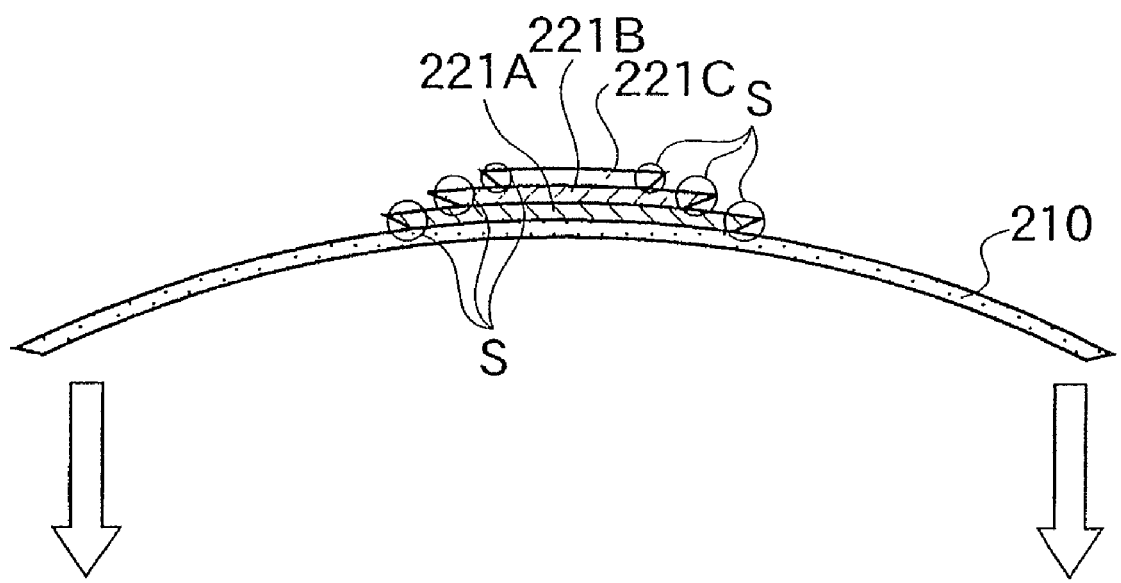
FIG. 17 is an explanatory drawing that schematically shows a bent state of the multi-layer wiring board in accordance with the second embodiment of the present invention.

In this arrangement, the resin base materials 221A, 221B and 221C with single-sided wiring circuits that have been laminated on the motherboard 10 have a pyramid shape, and therefore, when the motherboard 210 is bent as schematically shown in FIG. 17, portions S, which are subject to stress, and located between the motherboard 210 and the resin base material 221A with single-sided wiring circuit as well as between the laminated resin base materials 221A, 221B and 221C with single-sided wiring circuits, are dispersed.

With this arrangement, stress concentration is alleviated so that the anti-separation strength (peel strength) is improved, thereby making it possible to provide a multi-layer wiring board having high anti-bending strength. In particular, a superior bending property, which is a feature of the multi-layer flexible printed wiring board (FPC), is properly exerted so that the features of the multi-layer flexible printed wiring board are exerted to the maximum.

Next, referring to FIGS. 18A to 18F, a manufacturing method for the resin base material with single-sided wiring circuit that forms the multi-layer wiring board of the above-mentioned second embodiment will be described below. Different from the conventional substrate, the resin base material with single-sided wiring circuit in accordance with the present embodiment, which is not limited by the outer shape (formation position of the partial Iti-1a er substrates) of the motherboard, and makes it possible to assemble the resin base plates with single-sided wiring circuits that have the same shape or different shapes onto the base original plate over a maximum area.

Figure 18A:
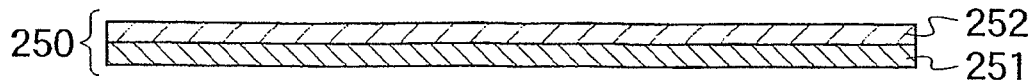
FIGS. 18A to 18F are flow charts that show a manufacturing method for a resin base material with single-sided wiring circuit, which is used for the multi-layer wiring board in accordance with the second embodiment of the present invention.
Figure 18B:

By using a polyimide base material 250 having single-sided copper foil 252 placed on one surface of a polyimide base material 251 as shown in FIG. 18A as a starting material. The copper foil 252 is etched through a subtractive method so that a base material 260 having a circuit portion 253 formed thereon as shown in FIG. 18B is prepared. This base material may also be obtained by using a polyimide base material without copper foil as a starting material, through an additive method or a semi-additive method.

Figure 18C:
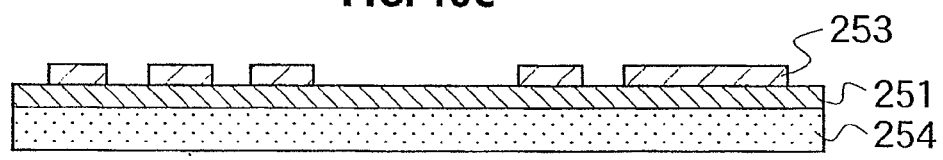

Next, as shown in FIG. 18C, an adhesive layer 254 is formed on a surface of the base material 260 with the circuit formed thereon on the overside of the circuit portion 253. With respect to the adhesive layer 254, a material prepared by imparting a thermosetting property to a thermoplastic polyimide a thermosetting resin typically represented by epoxy or a thermoplastic resin, such as thermoplastic polyimide, may be used.

Here, the three-layer structure of the circuit portion (copper foil) 253, the polyimide base material 251 and the adhesive layer 254 has an asymmetrical structure with respect to the surface and the rear surface thereof so that it is preferable to prevent undesired warping from occurring in the succeeding processes after the formation of the layering layer. Moreover, the adhesive layer 254 is preferably set to have a glass transition temperature of not more than 110° C. and a normal-temperature elastic modulus of not more than 1300 MPa.

Figure 18D:
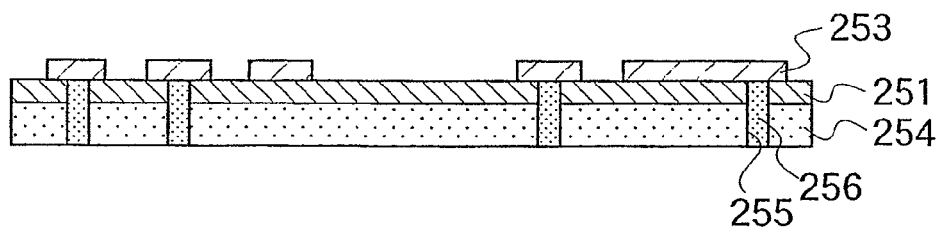

Next, as shown in FIG. 18D, after a hole-forming process (via-hole forming process) has been carried out with a UV-YAG laser beam so as to penetrate the adhesive layer 254 and the polyimide base material 251, a desmear process is carried out by soft etching through plasma irradiation so that the hole (via hole) 55 is filled with hole-filling-use silver paste 56 to form an NH.

Here, by using a carbon dioxide laser, an excimer laser or the like, it becomes possible to carry out the processes at higher speeds. Moreover, with respect to the desmear method, a wet desmear process using permanganate is also generally used With respect to the IVH filling conductive paste, in addition to silver paste, various metal pastes, such as copper paste, carbon paste and nickel paste, may be used.

After filling the conductive paste, the conductive paste 256 is provisionally cured at 60° C. to 140° C. for 0.5 to 2 hours. Thus, the conductive paste 256 is cured to have a hardness of not less than 2B on the basis of pencil hardness, thereby making it possible to prevent coming off or deformation of the paste during a die-releasing process or a packaging process, which will be described later.

Figure 18E:
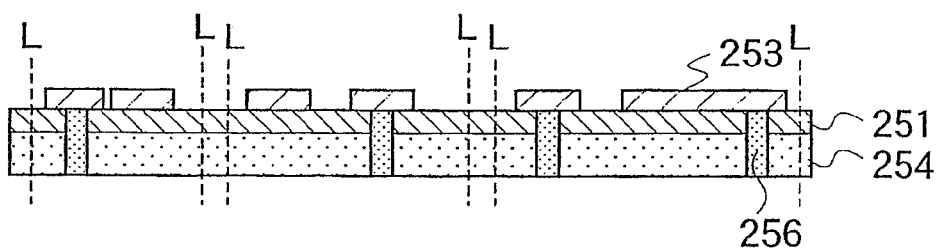
Figure 18F:
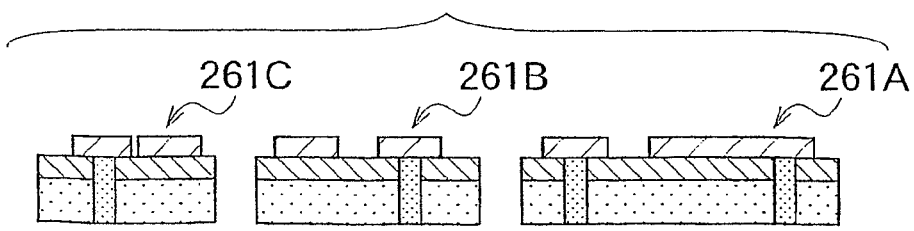

Next, as shown in FIG. 18E, a die pressing process is applied along a dot line L so that an outer-shape machining process is carried to form a predetermined shape, thus, three resin base materials 261A, 261B and 261C with single-sided wiring circuits, which have respectively different sizes (areas) that vary step by step as shown in FIG. 18F, are formed. More specifically, the respective resin base materials 261A, 261B and 261C are designed so that the outer shape of the second base material 261B (or 261C) bonded to the first base material is located inside the outer shape of the first base material 261A (or 261B) on the motherboard side.

Figure 19A:
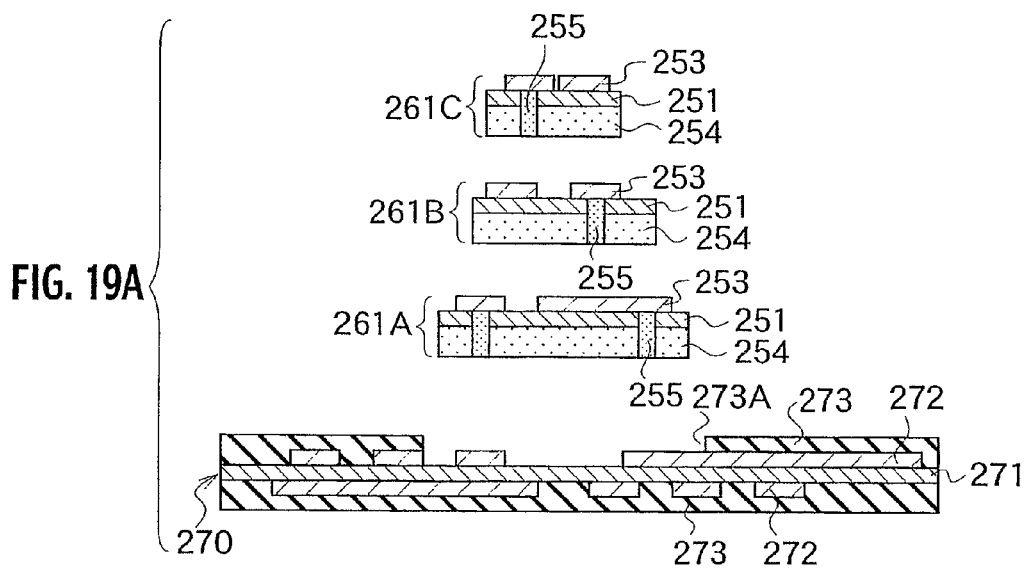
FIGS. 19A to 19C are flow charts that show a manufacturing method for the multi-layer wiring board in accordance with the second embodiment of the present invention.
Figure 19B:
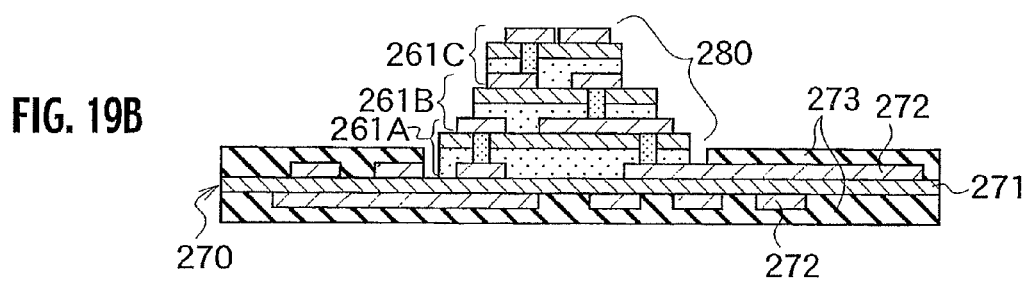
Figure 19C:
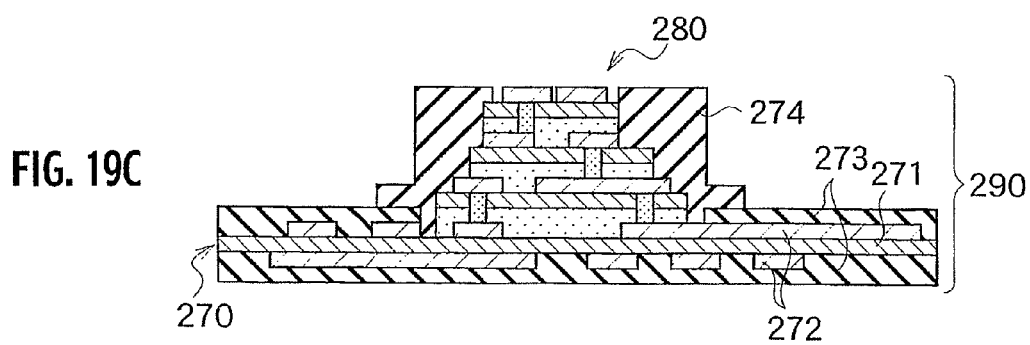

With reference to FIGS. 19A to 19C, manufacturing methods (laminating methods) for the multi-layer wiring boards of the embodiment 2 by using the base material produced as described above will be described below.

As shown in FIG. 19A, a motherboard FPC 270 has wiring circuits 272 formed on both of the surfaces of a flexible insulating base material 271 and is provided with a cover layer 273 with an opening (opening section 273A) formed at a portion to receive laminated layers that is formed on the surface thereof, resin base materials 261A, 261B and 261C with single-sided wiring circuits, which have outer shapes that have been formed into predetermined shapes, are positioned in succession, and superposed into a pyramid shape.

Next, a batch pressing process is carried out on the motherboard FPC 270, the resin base materials 261A, 261B and 261C by a vacuum heat pressing machine under a degree of vacuum of not more than 1 kPa so that a substrate containing a multi-layer portion 280 as shown in FIG. 19B is formed. Moreover, simultaneously with the batch pressing process, the motherboard FPC 270, the resin base materials 261A, 261B and 261C are heated in the range of 150° C. to 190° C. for about one hour to carry out a main curing process on the conductive paste. Thus, it becomes possible to provide efficient operations, and also to prevent resin deterioration in the lower-layer portion due to repeated heating processes.

Upon positioning the respective resin base materials 261A, 261B and 261C, rather than adopting a pin-alignment method that requires a space used for forming a pin hole, a positioning process using image recognition is more preferably adopted.

Next, as shown in FIG. 19C, solder resist 274 is applied by using a print method in a manner so as to cover a gap between the cover layer 273 of the motherboard FPC 270 and the multi-layer portion 280 as well as one portion of the surface of the multi-layer portion 280 and one portion of the surface of the cover layer 273, and cured thereon to form a multi-layer wiring board 290.

By repeating the processes shown in FIGS. 19A to 19C, the aforementioned multi-layer wiring board shown in FIG. 15 is formed.

The multi-layer wiring board in accordance with the second embodiment has at least features described below:

(1) The multi-layer wiring board is provided with a motherboard 210 having a first surface, a first base material 221A with single-sided wiring circuit, which is bonded to the first surface, and has an outer shape that has been formed into a predetermined shape and a second base material 221B with single-sided wiring circuit, which is bonded to the surface of the first base material, and has an outer shape that has been formed into a predetermined shape, and in this arrangement, the first base material is provided with a first inner via hole 225 that electrically connects a wiring on the motherboard to a wiring on the first base material, and the second base material is provided with a second inner via hole 225 that electrically connects a wiring on the first base material to a wiring on the second base material, and when viewed from the direction of the normal line of the motherboard, the outer shape 229 of the second base material 221B bonded to the surface of the first base material is located inside the outer shape 229 of the first base material 221A bonded to the first surface of the wiring board.

(2) When viewed from the direction of the normal line of the motherboard, the outer shape 229 of the third base material 221C bonded to the surface of the second base material is located inside the outer shape 229 of the second base material 221B.

(3) A first base material peripheral edge line 229 that determines the peripheral edge of the rear surface of the first base material bonded to the first surface of the motherboard is located inside a motherboard print peripheral edge line 229 that determines the peripheral edge of the motherboard, without contacting the corresponding line.

Third Embodiment

Figure 20:
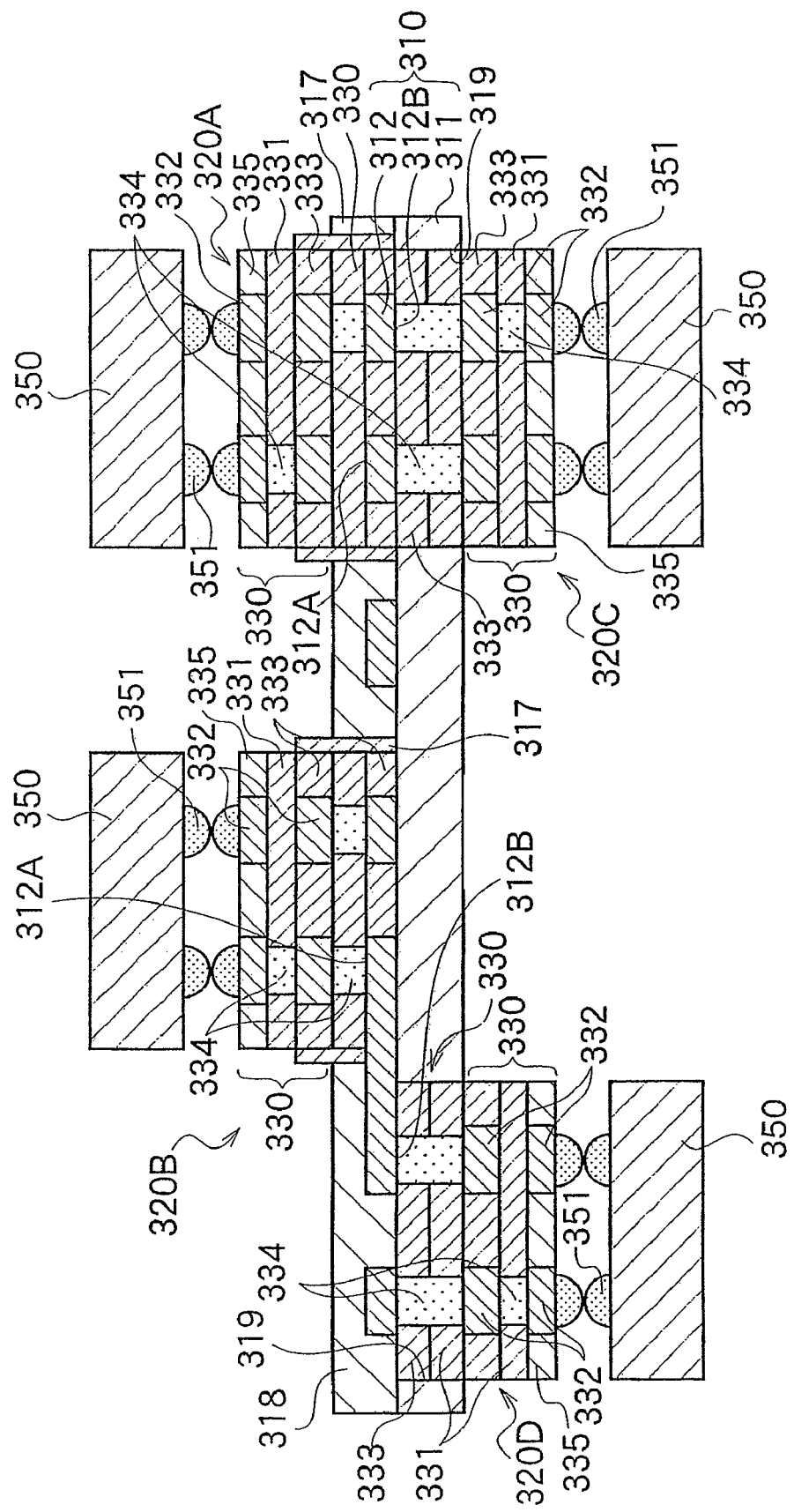
FIG. 20 is a cross-sectional view that shows a multi-layer wiring board in accordance with a third embodiment of the present invention.
Figure 21:
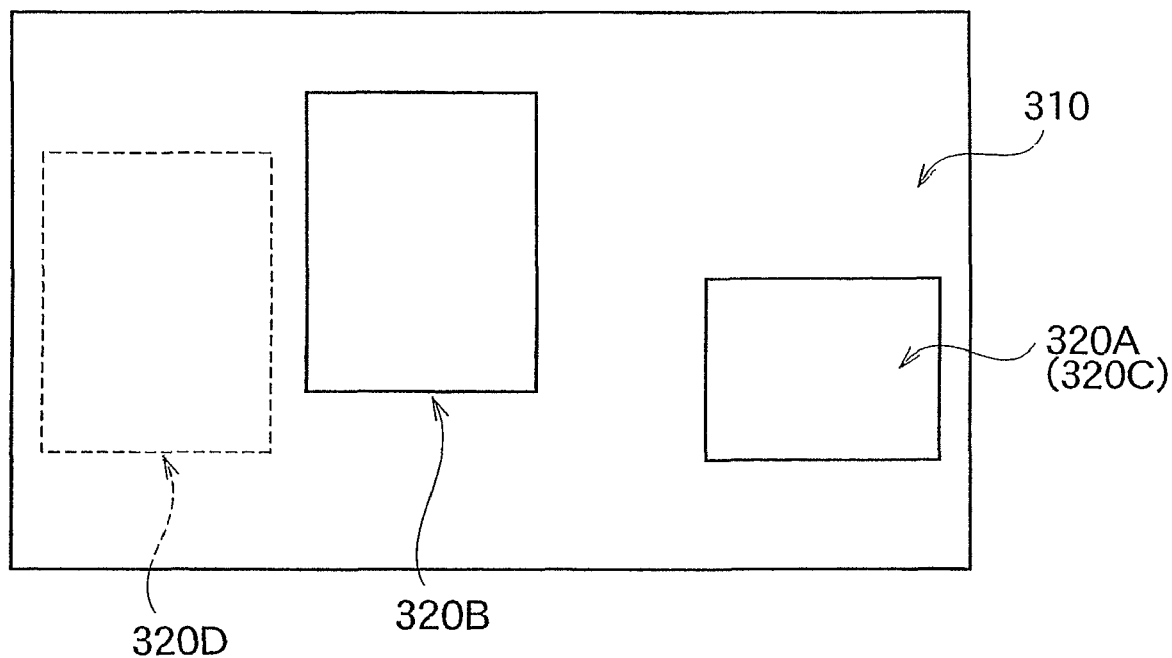
FIG. 21 is a plan view that shows the multi-layer wiring board in accordance with the third embodiment of the present invention.

FIGS. 20 and 21 show a multi-layer wiring board in accordance with a third embodiment. This multi-layer wiring board is characterized by having a motherboard 310 and partial multi-layer wiring boards (multi-layer portions) 320A, 320B, 320C and 320D that have island shapes and respectively laminated at a plurality of portions on the surface and rear surface of the motherboard printed substrate 310. Here, the island shape is defined as a state in which the peripheral sides of the partial wiring boards 320A to 320D are not coincident with the peripheral sides of the motherboard 310 so that the partial wiring boards 320A to 320B are placed inside the area determined by the peripheral sides of the motherboard 310.

Here, the predetermined shapes are determined by requirements in designing the motherboard.

The partial multi-layer wiring boards 320A, 320B, 320C and 320D are formed as follows: a plurality of single-sided circuit board for multi-layer wiring boards 330, which have outer shapes that have been formed into predetermined shapes that are smaller than the outer shape of the motherboard 310, are laminated on the surface and rear surface of the motherboard 310 by a batch process. In the present embodiment, each of the partial multi-layer wiring boards 320A, 320B, 320C and 320D has a two-layer structure.

Each of the single-sided circuit board for multi-layer wiring boards 330 has an insulating base material 331, a conductive pattern 332 formed on one surface of the insulating base material 331, a layering layer 333 bonded to the other surface of the insulating base material 331 and an interlayer conductive portion 334 prepared as an inner via hole formed in a manner so as to penetrate the insulating base material 331 and the layering layer 333.

The single-sided circuit board for multi-layer wiring board 330 may be prepared as either a rigid printed wiring board made from a material such as a phenol-based resin and an epoxy-based resin, or a flexible printed wiring board made from a material such as a polyester-based resin and a polyimide-based resin. Here, in the case when the insulating substrate 331 of the single-sided circuit board for multi-layer wiring board 330 has an interlayer layering property, the layering layer 333 may be omitted.

Among the single-sided circuit board for multi-layer wiring boards 330 of the partial multi-layer wiring boards 320A, 320B, 320C and 320D, the surface of the single-sided circuit board for multi-layer wiring board 330 performing as the outermost layer is coated with solder resist 335.

The single-sided circuit board for multi-layer wiring board 330 performing as the outermost layer of each of the partial multi-layer wiring boards 320A, 320B, 320C and 320D is provided with an electronic part 350 packaged thereon through a bump 351. Thus, it is possible to provide a double-sided multi-layer/double-sided packaging circuit substrate.

The motherboard 310 is prepared as a main single-sided circuit substrate having a conductive pattern 312 formed on one surface of an insulating base material 311. In he motherboard 310, at least one portion (two portions in this embodiment) of the insulating base material 311 is partially removed with the rear surface of the conductive pattern 312 being exposed at the removed portion 319 of the insulating base material 311. Further, on the other face side (rear face side) of the insulating se material 311, the single-sided circuit board for multi-layer wiring boards 330 of partial multi-layer wiring boards 320C and 320D are laminated in a manner so as to be conduction-connected to a rear-surface exposure portion 312B of the conductive pattern 312 to form the partial multi-layer wiring boards 320C and 320D.

Here the single-sided circuit board for multi layer wiring boards 330 of the partial multi-layer wiring boards 320A and 320B are laminated on one surface (surface) of the insulating base material 311 in a manner so as to be electrically connected to a surface exposure portion 312A of the conductive pattern 312 to form the partial multi-layer wiring boards 320A and 320B.

The motherboard 310 may also be prepared as either a rigid printed wiring board made from a material such as phenol-based resin and an epoxy-based resin, or a flexible printed wiring board made from a material such as a polyester-based resin and a polyimide-based resin.

The surface of the motherboard 310 is coated with a cover layer 318. Moreover, a gap portion between the cover layer 318 and the partial multi-layer wiring boards 320A and 320B is filled with solder resist 317 applied thereto.

With reference to FIGS. 22 to 25, a manufacturing method of circuits substrates constituting a multi-layer wiring board in accordance with the present embodiment described above will be described below.

Figure 22A:
FIGS. 22A to 22E are flow charts that show manufacturing processes of a motherboard that is used for the multi-layer wiring board in accordance with the third embodiment of the present invention.

FIGS. 22A to 22E show manufacturing processes of the motherboard 310. As shown in FIG. 22A, a general-use single-sided copper coat polyimide base material (single-sided conductor coat lamination plate) 360 is used as a starting material. The single-sided copper coat polyimide base material 360 is a single-sided copper coat lamination plate (CCL) having copper foil 316 placed as a conductor layer on only one of the surfaces of the insulating base material 311 made of a polyimide film.

Here, polyimide is selected as the insulating base material from the viewpoints of heat resistance and dielectric properties of the substrate, and other substrates such as a steel coat phenol substrate, a copper coat paper epoxy substrate, a steel coat paper polyester substrate, a copper coat glass epoxy substrate and a copper coat glass polyimide substrate, composed of a base material made from base material, such as glass cloth, glass mat and synthetic fibers, and a thermosetting resin, may be used. Moreover, with respect to a structure in which no base material is combined, a copper coat polyester substrate, a copper coat polyether imide substrate and a copper coat liquid crystal polymer substrate may be used.

Figure 22B:
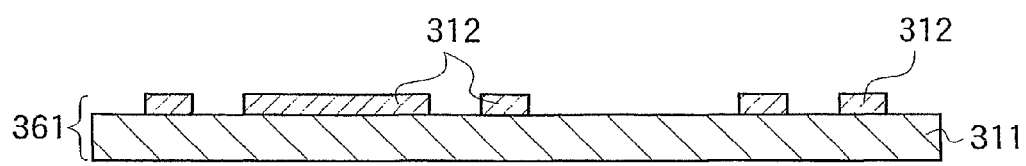

First, in a conductive pattern forming process, etching resist is laminated on a copper foil 316 of the single-sided copper coat polyimide base material 360, and this is subjected to exposure to form a wiring pattern thereon, and then developed. Thereafter, the exposed copper is etched through a cupric chloride bath to form a conductive pattern 312. Subsequently, the etching resist is removed so that a single-sided circuit substrate 361, shown in FIG. 22B, is formed.

Figure 22C:
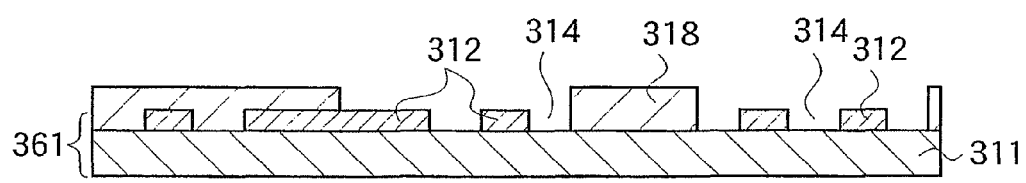

As shown in FIG. 22C, on the surface (upper surface) of the single-sided circuit substrate 361, a cover layer 318, which has a portion (surface-side multi-layer portion) 314 for receiving laminated single-sided circuit board for multi-layer wiring boards 330 preliminarily formed therein as an opening, is placed in order to protect the conductive pattern 312. With respect to the material for the cover layer 318, solder resist and the like may be used.

Figure 22D:
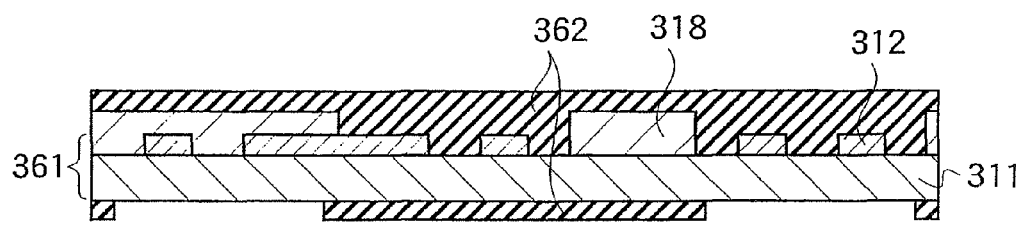

Next, in an insulating base material removing process, as shown in FIG. 22D, etching resist 362 is laminated on both of the surfaces of the single-sided circuit substrate 361, and the copper foil side (surface side) is entirely subjected to exposure, and the polyimide side (rear surface side) is subjected to exposure to form an opening pattern, and then developed.

Thereafter, the insulating base material 311 made from polyimide is etched by using oxygen plasma or a strong alkali aqueous solution. Upon completion of the etching, the etching resist 362 is removed. Thus, as shown in FIG. 22E, the insulating base material 311 of the single-sided circuit substrate 361 is partially removed over a predetermined area so that a motherboard 310 in which the rear surface 312B of the conductive pattern 312 is exposed to the removed portion (rear-surface-side multi-layer portion) 319 of the insulating substrate 311 is formed.

Additionally, the insulating base material removing process for forming the removed portion 319 in the insulating base material 311 may also be carried out by a laser process which applies a laser beam from the rear surface side of the insulating base material 311.

Figure 22E:
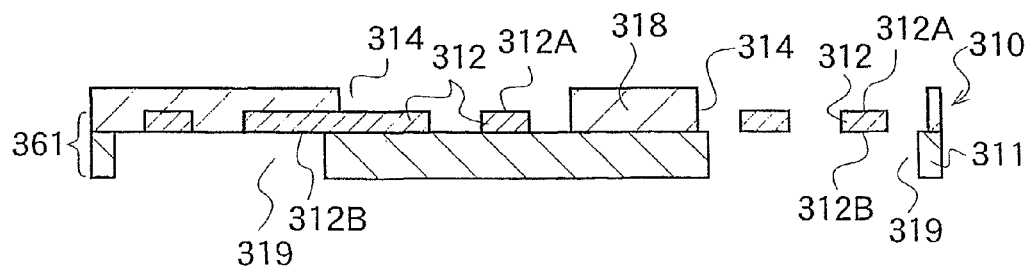
Figure 23:
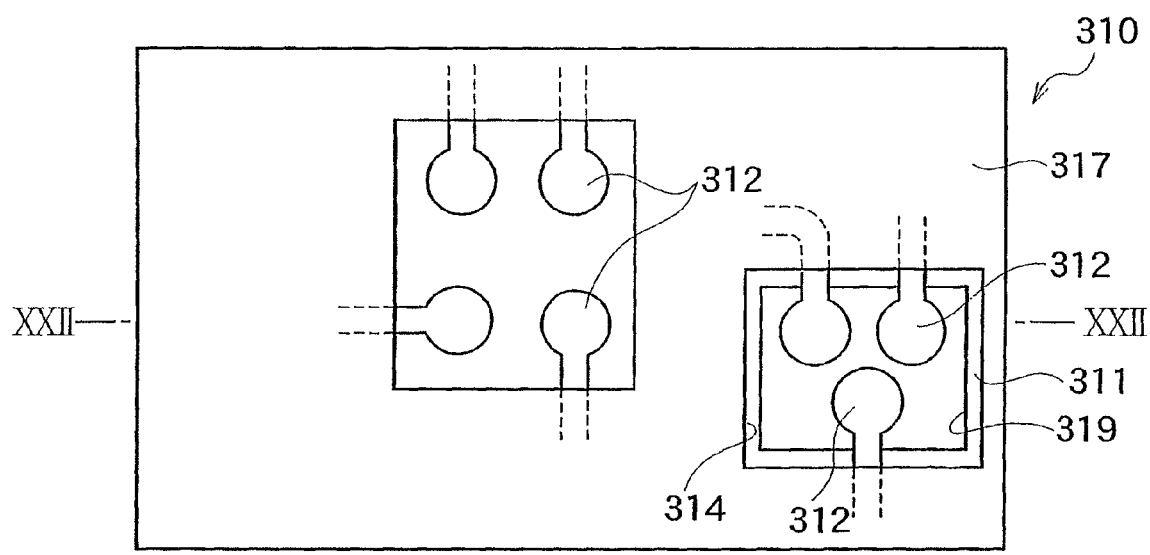
FIG. 23 is a plan view that schematically shows the motherboard that is used for the multi-layer wiring board in accordance with the third embodiment of the present invention.

FIG. 23 is a schematic plan view that shows the motherboard 310, and FIG. 22E is a cross-sectional view taken along line XXII-XXII in FIG. 23.

Figure 24A:
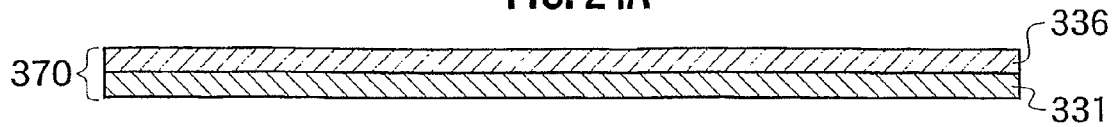
FIGS. 24A to 24F are flow charts that show manufacturing processes for a single-sided circuit board for multi-layer wiring board to be used in the multi-layer wiring board in accordance with the third embodiment.

With reference to FIGS. 24A to 24F, manufacturing processes of a in le-sided circuit board for multi-layer wiring board 330 in accordance with the present embodiment will be described below. As shown in FIG. 24A, a general-use single-sided copper coat polyimide base material (single-sided conductor coat lamination plate) 370 is prepared as a starting material.

The single-sided copper coat polyimide base material 370, which is the same as the single-sided copper coat polyimide base material 360 for use in the motherboard 310, is a single-sided copper coat lamination plate (CCL) having copper foil 336 placed as a conductor layer on only one of the surfaces of the insulating base material 331 made of a polyimide film.

Here, the insulating base material 311 of the motherboard 310 and the insulating base material 331 of the single-sided circuit board for multi-layer wiring board 330 are preferably made from the same material from the viewpoints of thermal and mechanical properties.

Figure 24B:
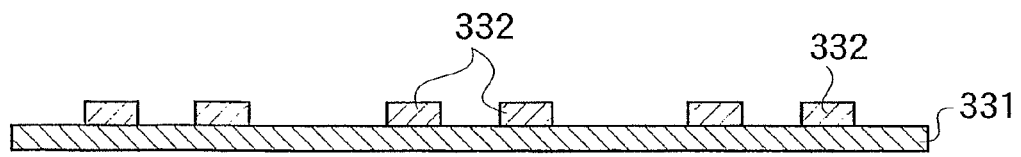

First, as shown in FIG. 24B, the copper foil 336 of the single-sided copper coat polyimide base material 370 is etched in the same manner as the forming process of the motherboard to form a conductive pattern 332.

Figure 24C:
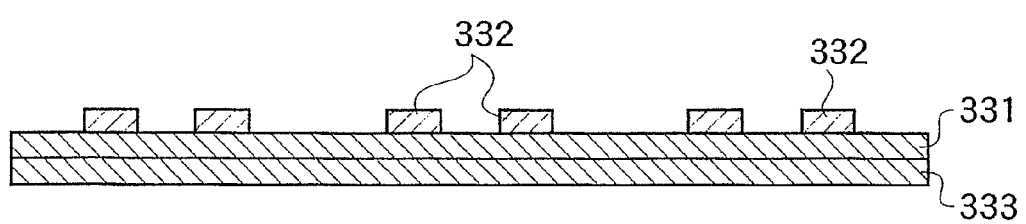

Subsequently, as shown in FIG. 24C, thermoplastic polyimide is joined to the surface of the insulating base material 331 on the side opposite to the conductive pattern 332 by using a heat pressing machine to form a layering layer 333. With respect to the layering layer 333, other materials, such as phenolic resin, phenoxy resin, polyimide resin and xylene resin, or mixed resin of two of more kinds of these, polyether imide resin, liquid crystal polymer and polyamide resin, may be used.

Figure 24D:
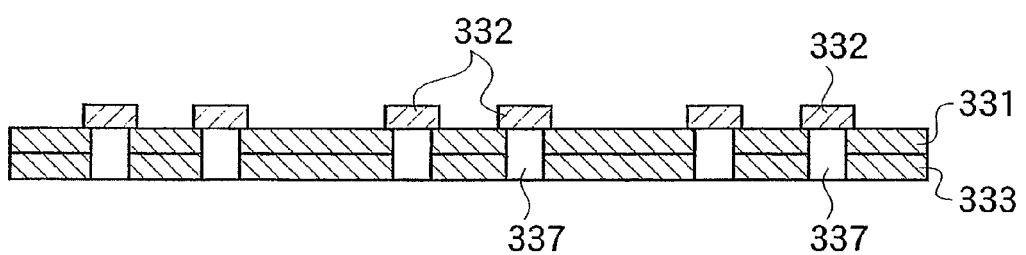

Next, as shown in FIG. 24D, a laser beam is applied from the layering layer 333 side to a desired position to be used for interlayer connection, to penetrate the insulating base material 331 and the layering layer 333, thereby forming a hole (via hole) 337 that contacts the copper foil (conductive pattern 332).

Figure 24E:
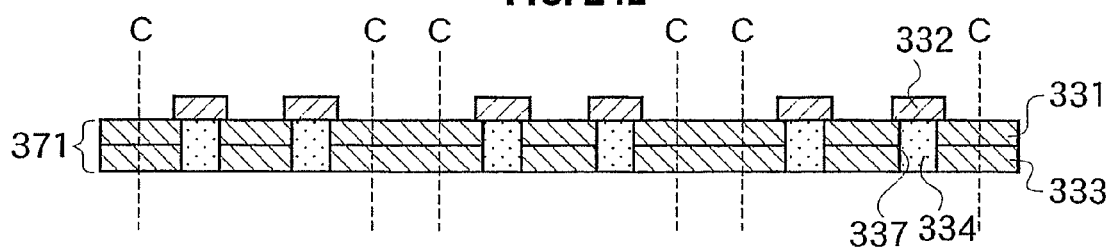

Subsequently, as shown in FIG. 24E, thermosetting silver paste is embedded and injected into the hole 337 through a print method or the like to form an interlayer conductive portion 334. With respect to the conductive paste to be injected into the hole 37, materials, such as gold, copper, nickel or carbon powder, or a conductive composition prepared by mixing alloy powder or mixed powder of these and a binder component such as phenolic resin, polyester resin, epoxy resin and polyimide resin, can be used.

Here, with respect to the printing/injecting process of the conductive paste, a print method using a metal mask, a print method using a masking film and an injecting method using a dispenser can be used.

Subsequently, the lamination base material 371 on which the silver paste has been printed is heated in an oven so that the silver paste is dried.

Figure 24F:
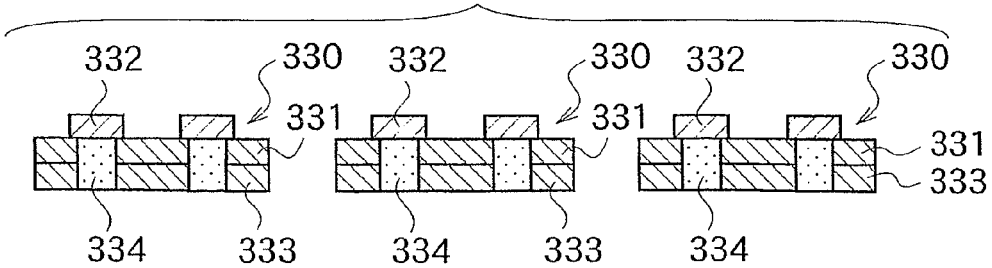

The lamination base material 371 is pressed by using a die to form an outer shape thereof that is smaller than the outer shape of the motherboard 310 as indicated by dot line C. Thus, as shown in FIG. 24F, a single-sided circuit board for multi-layer wiring boards 330 having a desired size is prepared. In this outer-shape forming process, in order to allow the single-sided circuit board for multi-layer wiring board 30 to enter the surface side multi-layer portion (opening portion) 314 of the cover layer 318 and the removed portion 319 of the insulating base material (opening portion) 311, the size thereof is set to virtually the same size of these openings or a size slightly smaller than these openings.

Figure 25A:
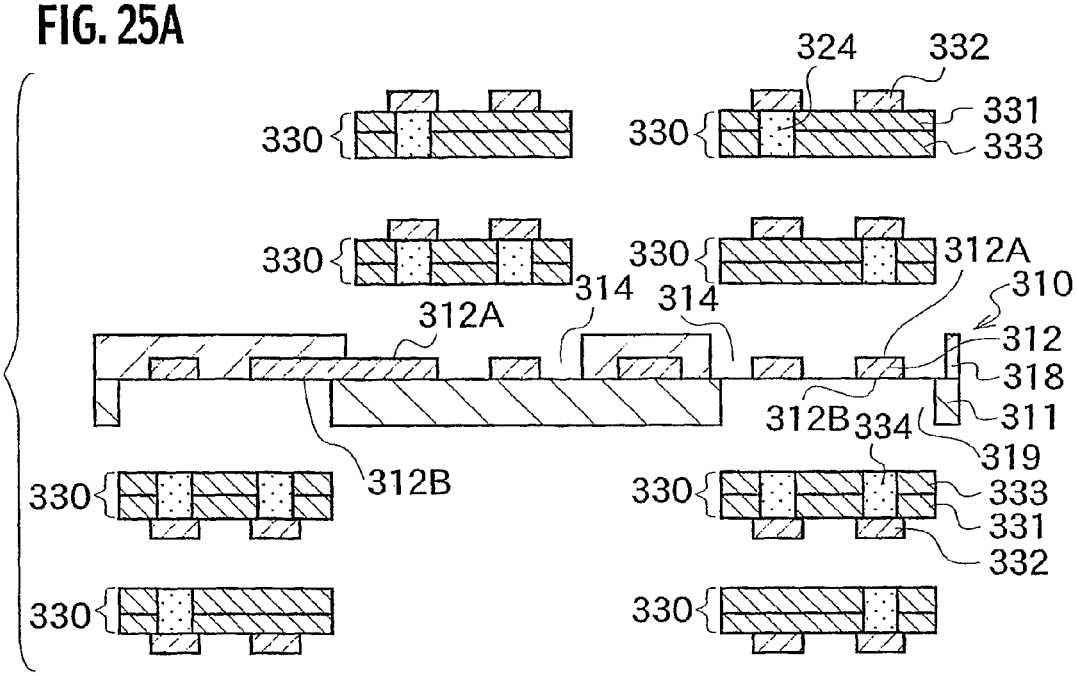
FIGS. 25A to 25C are flow charts that show laminating processes of the single-sided circuit board for multi-layer wiring board in accordance with the third embodiment of the present invention.
Figure 25B:
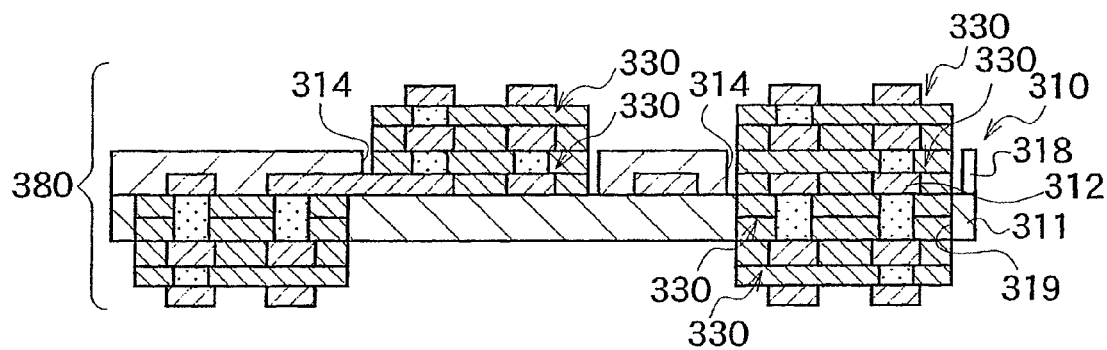

Next, referring to FIGS. 25A to 25C, laminating processes of the motherboard 310 and the single-sided circuit board for multi-layer wiring board 330 that are formed through the above-mentioned manufacturing processes will be described below. A plurality of the single-sided circuit board for multi-layer wiring boards 330, manufactured through the above-mentioned processes, are prepared. As shown in FIG. 25A, a predetermined number of the single-sided circuit board for multi-layer wiring boards 330 are respectively positioned on the surface-side multi-layer portions 314 on the conductive pattern 312 side (surface side) of the motherboard 310 and the respective removed portions 319 on the rear-surface side of the insulating base material 311. After the completion of the positioning processes, the respective members are superposed, and heated and pressed by a vacuum pressing machine so that a double-sided lamination circuit substrate 380, as shown in FIG. 25B, is formed.

With respect to the positioning processes, rather than adopting a pin-alignment method that requires a space used for forming a pin hole, a positioning process using image recognition is more preferably adopted.

Figure 25C:
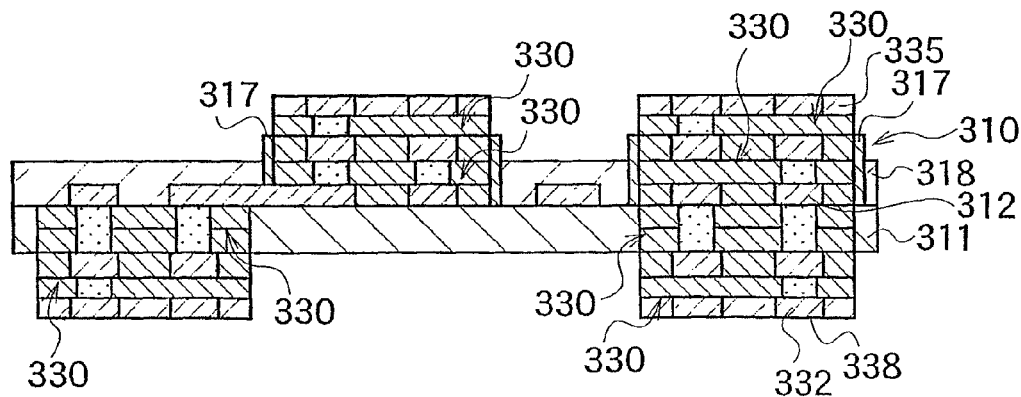

Next, as shown in FIG. 25C, pieces of solder resist 317 and 335 are applied by using a print method in a manner so as to cover a gap between the cover layer 318 of the motherboard 310 and the multi-layer portion as well as one portion of the surface of the multi-layer portion, and cured thereon.

Lastly, the conductive pattern 332, exposed so as to package an electronic part, is coated with noble metal 338 such as gold to form a multi-layer wiring board that allows double-sided packaging processes.

The above-mentioned circuit substrate has the following features and effects.

(1) By solving the problem that, when the single-sided wiring board is used as a motherboard, double-sided multi-layer forming processes and double-sided packaging processes are not available, the single-sided wiring board can be used as the motherboard 310, that is, the main single-sided circuit substrate. Therefore, different from the case using the double-sided circuit substrate, it is not necessary to remove most of the conductor layer on one surface upon formation of the conductive pattern, thereby making it possible to reduce wasteful use of materials and resources. Moreover, it is not necessary to provide complex manufacturing processes for forming through holes and the like.

(2) The single-sided wiring board is used as the motherboard 310. Therefore, in the case when the motherboard 310 is a flexible substrate, portions having no multi-layer structure are allowed to have a high bending property so that it is possible to provide a high-density double-sided partial multi-layer wiring board having a superior bending property.

(3) With respect to the partial multi-layer wiring board, that is, the in single-sided circuit board for multi-layer wiring board 330, those substrates that are formed to have outer shapes corresponding to the sizes of the partial multi-layer wiring portions are used. Therefore, in comparison with a case in which: those substrates corresponding to the partial multi-layer wiring portions are also prepared to have the same size as that of the motherboard 310, and upon forming the outer shape of the motherboard 310, each substrate is punched out to have the same outer shape as the motherboard 310, it is possible to reduce the quantity of materials for the multi-layer wiring board-use one-side circuit substrate 330, and consequently to cut wasteful use of materials.

Figure 26:
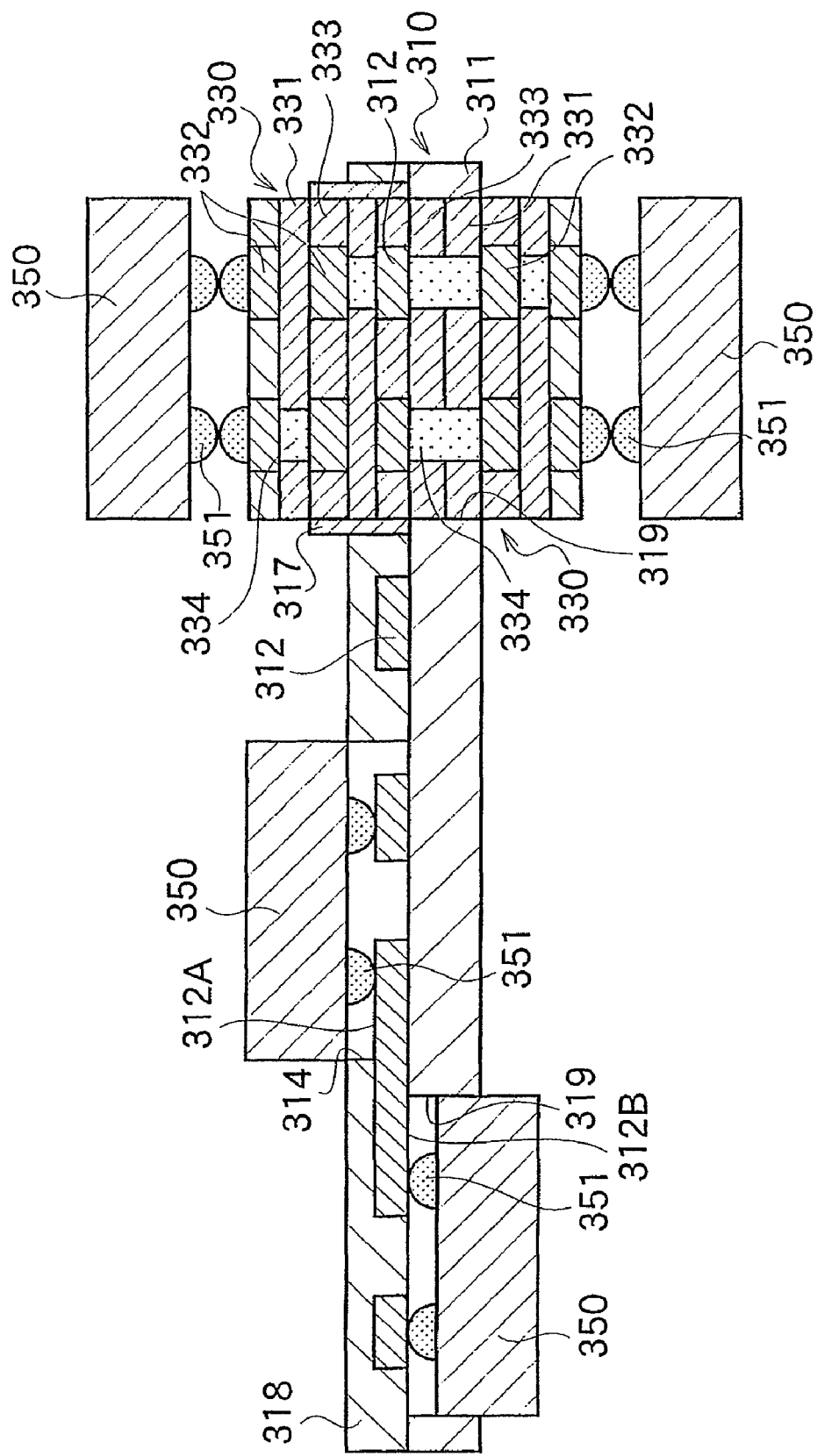
FIG. 26 is a cross-sectional view that shows a modified example of the multi-layer wiring board d in accordance with the third embodiment of the present invention.

Not limited to the above-mentioned double-sided lamination substrate, the circuit substrate of the present invention may have an arrangement in which as shown in FIG. 26, a flip-chip-type electronic part 350 may be directly packaged onto the conductive pattern 312 of the motherboard 310 and the removed portion 319 of the insulating base material 311. The packaging process of the electronic part 350 onto the removed portion 319 of the insulating base material 311 is carried out while being conduction-connected to the rear-face exposed portion 312B of the conductive pattern 312.

Fourth Embodiment

Figure 27:
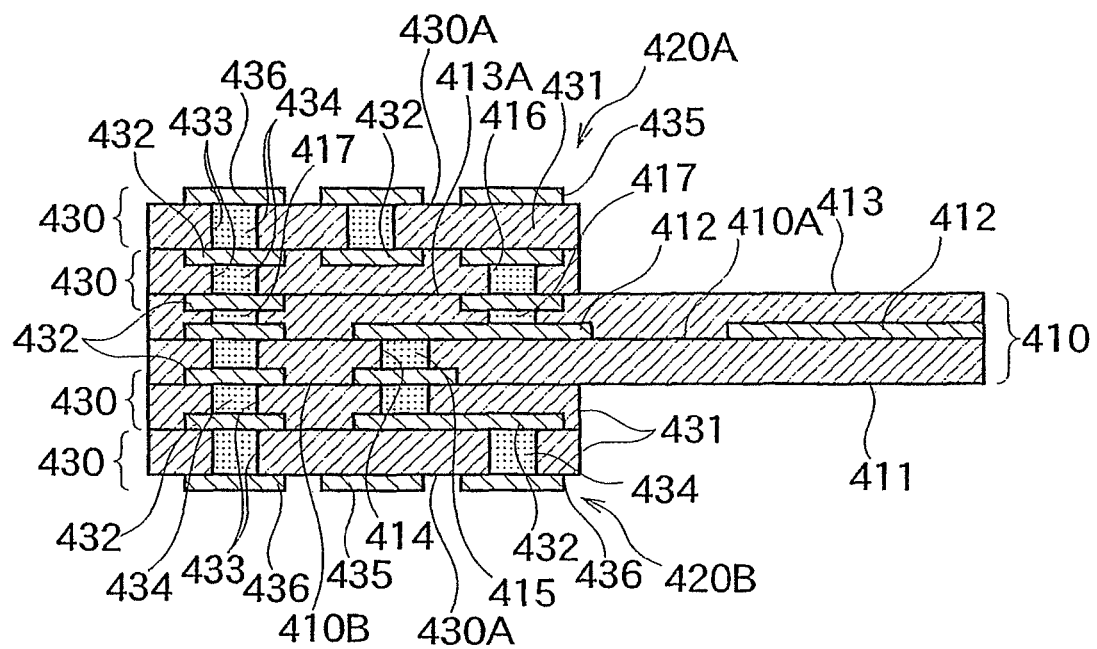
FIG. 27 is a cross-sectional view that shows a multi-layer wiring board in accordance with a fourth embodiment of the present invention.
Figure 28:
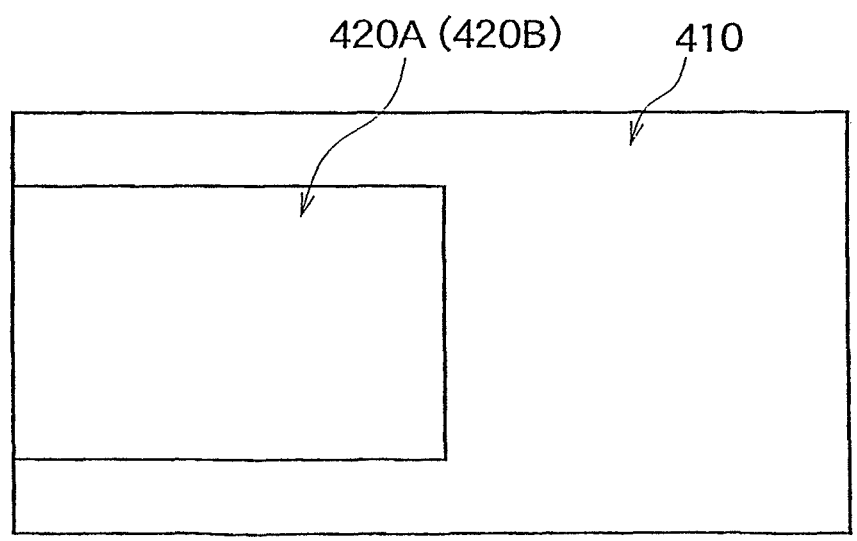
FIG. 28 is a plan view that schematically shows the multi-layer wiring board in accordance with the fourth embodiment of the present invention.

With reference to Figures, the following description will discuss a fourth embodiment of the present invention. FIGS. 27 and 28 show the fourth embodiment of a multi-layer wiring board in accordance with the present invention. This multi-layer wiring board is provided with a relay board 410 such as a motherboard wiring board and partial multi-layer portions 420A and 420B formed by respectively laminating partial multi-layer substrates 430 at specific portions on the surface and rear surface of the relay board 410.

The relay board 410 is constituted by a base material with single-sided wiring circuit that is provided with a conductor layer (including a conductor land portion) 412 forming a wiring pattern, which is formed on one surface (upper surface 410A) of an insulating base material 411 that is compatibly used as an adhesive layer. With respect to the material for the insulating base material 411 compatibly used as the adhesive layer, thermosetting polyimide, thermoplastic polyimide, thermoplastic polyimide to which a thermosetting property is imparted, liquid crystal polymer, epoxy resin and the like can be used.

On the conductor layer surface (upper surface 410A) forming the wiring pattern of the insulating board 411, an insulating resin layer 413, which also performs as an adhesive layer, is formed. The insulating resin layer 413 and the insulating board 411 may be made of the same material.

With respect to the relay board 410, interlayer conductive portions 415 and 417 formed by via holes 414 and 416 are respectively formed in the insulating base material 411 and the insulating resin layer 413. The interlayer conductive portions 415 and 417 are constituted by the via holes 414 and 416 in which conductive paste is embedded and injected.

On the surface of the insulating base material 411 on the side opposite to the conductor layer surface, that is, the rear surface 410B, and the surface (upper surface 413A) of the insulating resin layer 413, wiring board for partial multi-layers 430 having outer shapes that have been preliminarily formed into a predetermined shape are laminated in conductive-association with the conductor layer 412 forming the wiring pattern of the relay board 410 through the interlayer conductive portion 415 or 417.

In the same manner as the relay board 410, the wiring board for partial multi-layer 430 is also constituted by a base material with single-sided wiring circuit that is provided with a conductor layer (including a conductor land portion) 432 forming a wiring pattern, which is formed on one surface of an insulating base material 431 that is compatibly used as an adhesive layer. With respect to the wiring board for partial multi-layer 430, an interlayer conductive portion 434 is formed in the insulating base material 431 through a via hole 433. The interlayer conductive portion 434 is also constituted by the via hole 433 in which conductive paste is embedded and injected.

With respect to the wiring board for partial multi-layer 430, on the upper surface 410A side of the relay board 410, that is, on the partial multi-layer portion 420A, a plurality of them are laminated with the conductor layer 432 forming a wiring pattern facing down, and on the rear-surface 410B side of the relay board 410, that is, on the partial multi-layer portion 420B, a plurality of them are laminated with the conductor layer 432 forming a wiring pattern facing up, thus, these layers are bonded by the insulating base material 411, the insulating resin layer 413 or the insulating base material 431, which serve as adhesive layers between layers. In other words, the wiring board for partial multi-layers 430 are laminated on the upper side and the lower side of the relay board 410 with the conductor layer 432 side thereof forming a wiring pattern facing the relay board 410 side.

On the surface 430A of the insulating base material 431 of the wiring board for partial multi-layer 430 that forms the outermost layer of each of the partial multi-layer portions 420A and 420B, a conductor layer 435 forming a wiring pattern and a component-packaging-use conductor land portion 436 are formed.

With the above-mentioned structure, even when a lamination material having a conductor layer such as copper foil formed on only one surface of the insulating base material 411 is used as a starting material, a partial multi-layer structure is prepared at desired portions on both of the surface and rear surface of the relay board 410, thereby allowing double-sided packaging processes. Moreover, by using the wiring board for partial multi-layer 430 having an outer shape that has been preliminarily formed into a predetermined shape, it becomes possible to eliminate the necessity of preparing excessive multi-layer portions, and consequently to cut the number of processes and the material costs.

With reference to FIGS. 29A to 31, a manufacturing method for a substrate with a circuit that is used for a multi-layer wiring board in accordance with the present embodiment will be described below.

Figure 29A:
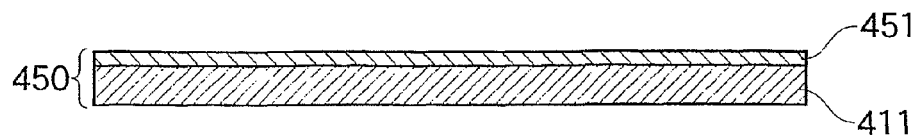
FIGS. 29A to 29E are flow charts that show manufacturing processes for a relay board to be used in the multi-layer wiring board in accordance with the fourth embodiment of the present invention.

FIGS. 29A to 29E show manufacturing processes of a relay board 410. As shown in FIG. 29A, a general-use single-sided copper coat polyimide base material (single-sided conductor coat lamination plate) 450 is used as a starting material. The single-sided copper coat polyimide base material 450 is a single-sided copper coat lamination plate (CCL) having copper foil 451 placed as a conductor layer on only one of the surfaces of the insulating base material 411 made of a polyimide film that exerts a layering property when heated. Here, a lamination plate in which a polyimide base material without copper foil is used as a starting material and a conductor layer is formed through an additive method or a semi-additive method may also be used.

Figure 29B:
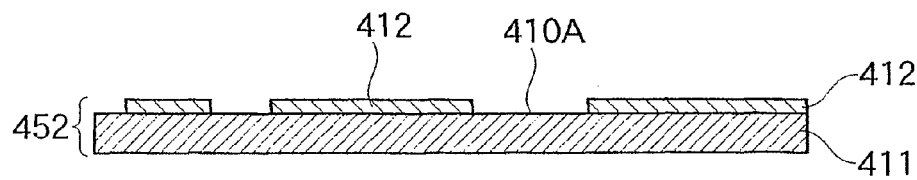

First, etching resist is laminated on the copper foil 451 of the single-sided copper coat polyimide base material 450, and this is subjected to exposure to form a wiring pattern thereon, and then developed. Thereafter, the exposed copper is etched through a cupric chloride bath to form a conductor layer (conductive pattern) 412. Subsequently, the etching resist is removed so that a substrate with single-sided circuit 452, shown in FIG. 29B, is formed.

Figure 29C:
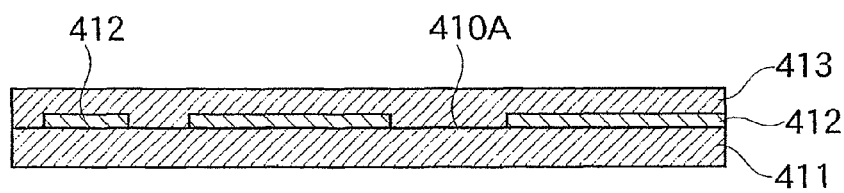

Subsequently, as shown in FIG. 29C, an insulating resin layer 413, which also performs as an adhesive layer, is formed on the conductor layer surface (upper surface 410A) being formed as a wiring pattern of the insulating base material 411. The insulating resin layer 413 may be formed by a polyimide film that is the same material as the insulating base material 411, thus, by using the film-shaped material, a layering process can be carried out on the upper surface 410A of the insulating base material 411 by using a contact-layering process, a laminating process or a vacuum laminating process through heat pressing or vacuum heat pressing. Moreover, the insulating resin layer 413 may also be formed through a coating process such as a curtain coating process and a spin coating process by using a precursor varnish of a resin material.

Figure 29D:
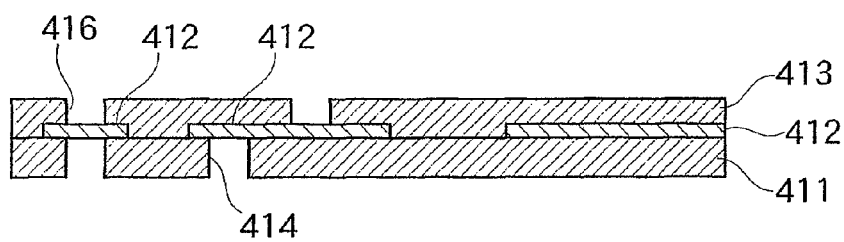

Subsequently, as shown in FIG. 29D, a UV-YAG laser beam, a carbon dioxide laser beam or the like is applied to a desired position to be used for interlayer connection from the insulating base material 411 side to form a via hole 414 that penetrates the insulating base material 11 to contact the rear surface of copper foil (conductor layer 412 forming a wiring pattern). Moreover, a UV-YAG laser beam, a carbon dioxide laser beam or the like is applied to a desired position to be used for interlayer connection from the insulating resin layer 413 side to form a via hole 416 that penetrates the insulating resin layer 413 to contact the upper surface of copper foil (conductor layer 412 forming a wiring pattern).

With respect to the hole-forming processes, besides the laser processes, the via holes 414 and 416 may be formed by forming etching resist having a pattern on the insulating base material 411 and the insulating resin layer 413 and by etching the insulating base material 411 and the insulating resin layer 413.

Figure 29E:
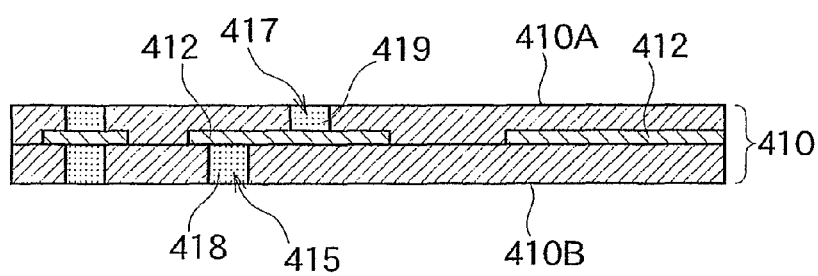

Subsequently, as shown in FIG. 29E, pieces of thermosetting silver paste 418 and 419 are embedded and injected into the via holes 414, 416 as conductive paste through a print method or the like to form interlayer conductive portions 415, 417. Thus, a relay board 410 is formed. Here, with respect to the conductive paste to be embedded and injected in the via holes 414 and 416, besides silver paste, conductive paste and the like including copper paste and conductive filler having copper powder coated with silver may be used.

With respect to the relay board 410, since the conductive layer 412 forming the wiring pattern, except for the interlayer conductive portions 415 and 417, is coated with the insulating resin layer 413, and therefore it is possible to omit the process for placing the cover layer for protecting the conductor layer 412 forming the wiring pattern.

Figure 30:
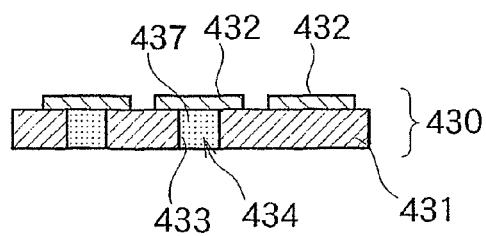
FIG. 30 is a cross-sectional view that shows a wiring board for partial multi-layer to be used in the multi-layer wiring board in accordance with the fourth embodiment of present invention.

FIG. 30 shows a wiring board for partial multi-layer 430. The wiring board for partial multi-layer 430 is formed by the following processes: A general-use single-sided copper coat polyimide base material that is the same as the starting material of the relay board 410 is used as a starting material, a conductor layer 432 forming a wiring pattern is formed through etching, a via hole 433 is formed through a laser process or the like, and an interlayer conductive portion 434 is formed by embedding and injecting silver paste 437 in the via hole 433.

As shown in FIG. 30, prior to the lamination process onto the relay board 410, the wiring board for partial multi-layer 430 is subjected to an outer-shape forming process (press punching process) and allowed to have a predetermined shape corresponding to the plane shape of the partial multi-layer portions 420A and 420B.

Figure 31A:
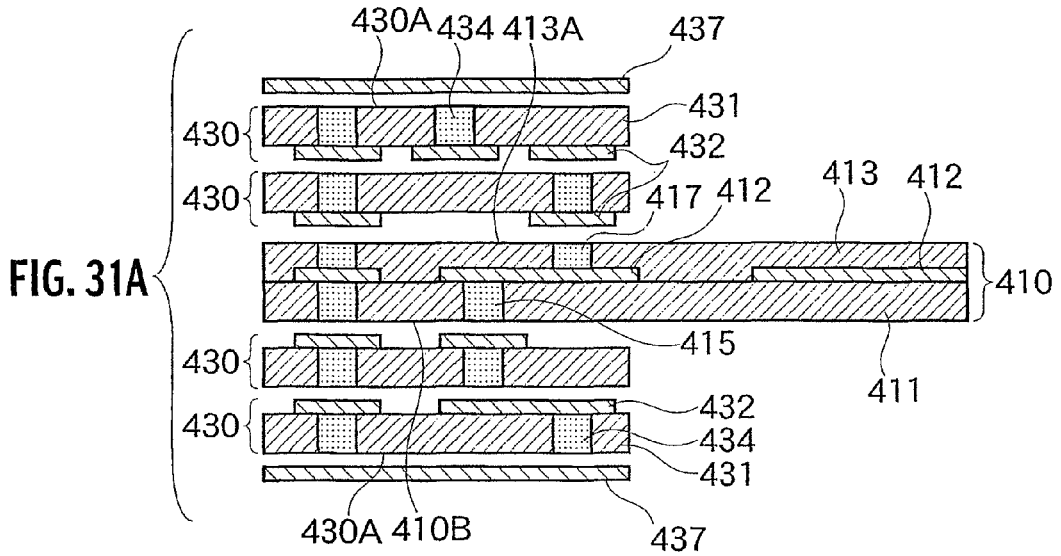
FIGS. 31A to 31C are flow charts that show laminating processes of the multi-layer wiring board in accordance with the fourth embodiment of the present invention.

FIG. 31 show lamination processes of the wiring board for partial multi-layer 430 manufactured through the above-mentioned processes. As shown in FIG. 31A, predetermined numbers of wiring board for partial multi-layers 430 having outer shapes that have been formed into predetermined shapes are respectively positioned at specific areas on the upper surface 413A of the insulating resin layer 413 and the rear surface 410B of the insulating base material 411 of the relay board 410 by using alignment marks, reference holes, circuit patterns or the like (not shown), and then superposed, and upper-surface and rear-surface outer-most-layer-use copper foils 437 are respectively placed on the surfaces 430A of the insulating base materials 431 on the upper side (surface side) and the lower side (rear-surface side). Here, on the respective upper side and lower side of the relay board 410, the wiring board for partial multi-layers 430 are laminated with the conductor layer 432 side forming a wiring pattern facing the relay board 410 side.

Figure 31B:
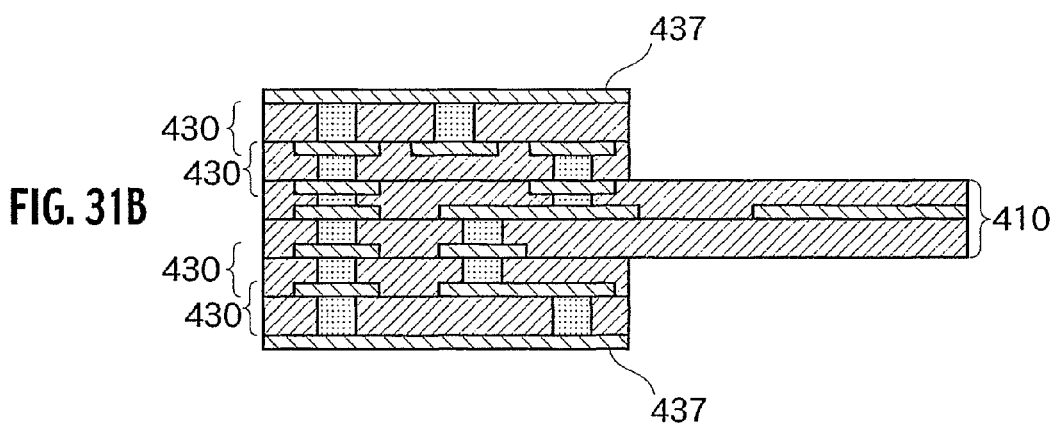

Further, as shown in FIG. 31B, above members are heated and contact-bonded under a high temperature and a high pressure by using a vacuum cure pressing machine or a cure pressing machine so that a batch multi-layer-forming process is carried out.

Figure 31C:
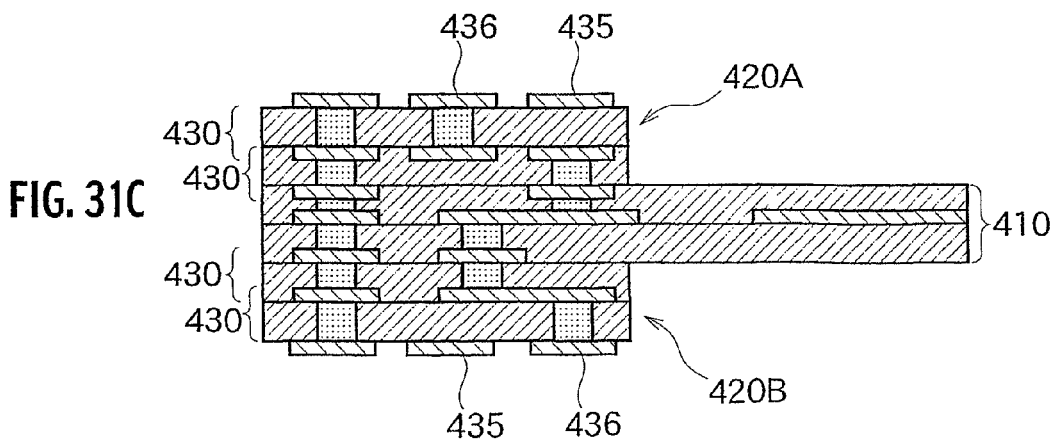

Lastly, as shown in FIG. 31C, the surface and rear-surface outermost-layer-use copper foils 437 are respectively etched so that a conductor layer 435 forming a wiring pattern and component-packaging-use conductor land portions 436 are formed. Thus, a multi-layer wiring board having partial multi-layer portions 420A and 420B is completed.

Figure 32:
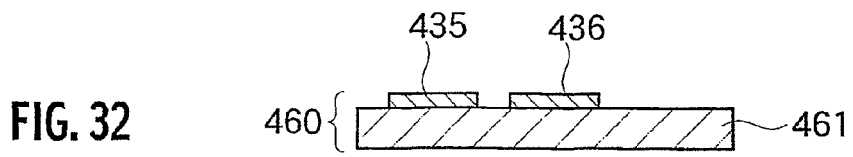
FIG. 32 is a cross-sectional view that shows one embodiment of a circuit-forming transfer tape to be used in the multi-layer wiring board in accordance with the fourth embodiment of the present invention.

The conductor layer 435 forming the wiring pattern on the outermost layer and the component-packaging-use conductor land portions 436 may also be formed by using a circuit-forming transfer tape 460 as shown in FIG. 32. The circuit-forming transfer tape 460 is formed on one surface of a carrier film 461 in a manner so as to allow the conductor layer 435 forming the wiring pattern and the component-packaging-use conductor land portions 436 to be separated therefrom through etching or the like.

Figure 33A:
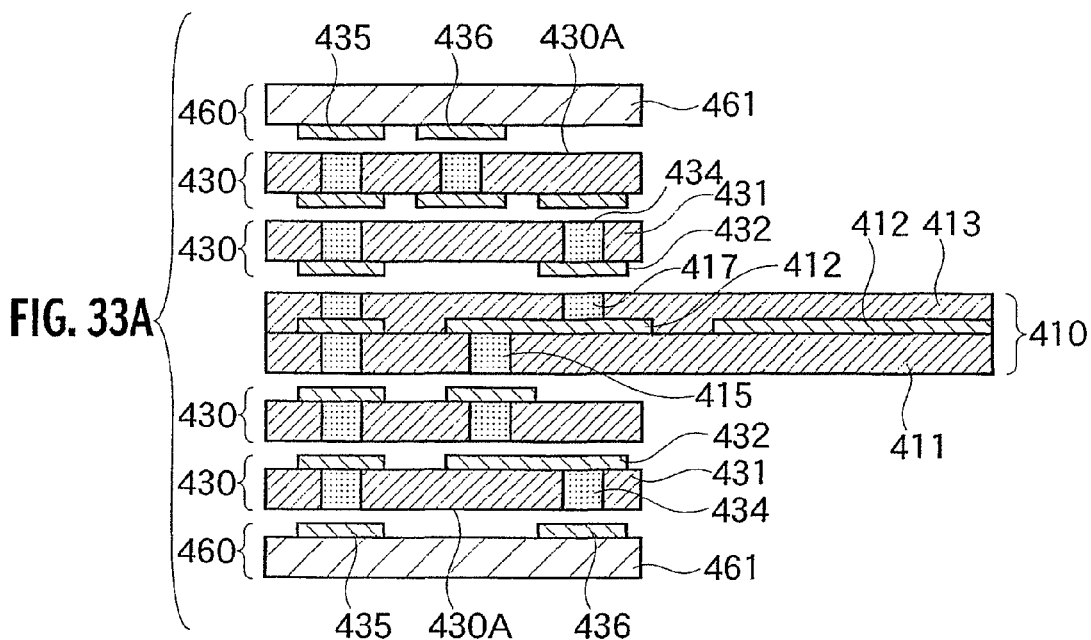
FIGS. 33A to 33C are flow charts that show laminating processes of the multi-layer wiring board in which the circuit-forming transfer tape for use in the multi-layer wiring board is used, in accordance with the fourth embodiment of the present invention.
Figure 33B:
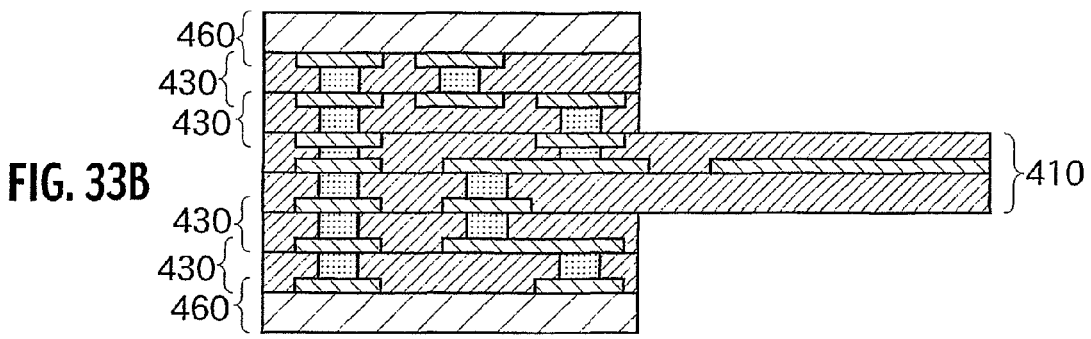
Figure 33C:
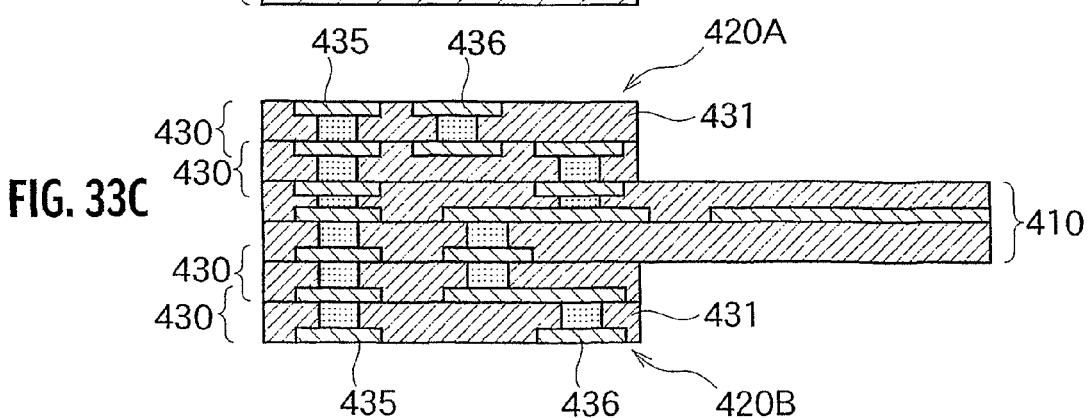

As shown in FIG. 33A, in place of the copper foil 437, the circuit-forming transfer tape 460 is placed and positioned on the surfaces 430A of the respective insulating base materials 431 on the upper side (surface side) and lower side (rear-surface side), with the conductor layer 435 forming the wiring pattern and the component-packaging-use conductor land portions 436 being located on the surface 430A side of the insulating base material 431. Moreover, after the curing process as shown in FIG. 33B, the carrier film 461 is removed as shown in FIG. 33C.

Thus, a multi-layer wiring board having the same properties as those of the aforementioned embodiments is provided. In this embodiment, the conductor layer 435 forming the wiring pattern on the outermost layer and the component-packaging-use conductor land portions 436 are pushed into the insulating base material 431 of the wiring board for partial multi-layer 430 through curing as shown in FIG. 33C. Therefore, it is possible to obtain smooth surface layers of the partial multi-layer portions 420A and 420B.

Figure 34:
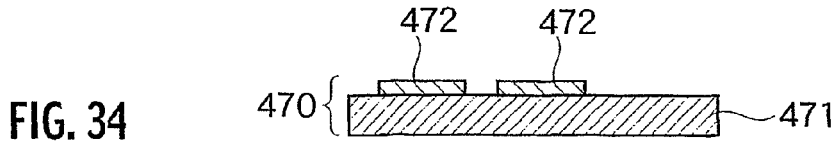
FIG. 34 is a cross-sectional view that shows a partial multi-layer substrate for use in an outer layer, which is used for the fourth embodiment of the present invention.

FIGS. 34 and 35 show the other multi-layer forming processes in accordance with the present embodiment. In this embodiment, as shown in FIG. 34, with respect to the surface and rear-surface outermost-layer members, a conductor layer forming a wiring pattern of the outermost layer, placed on one surface of the insulating base material 471, and an outermost-layer-use wiring board for partial multi-layer 470 formed by etching the component-packaging-use conductor land portions 472 are used. The outermost-layer-use wiring board for partial multi-layer 470 has an outer shape that has been formed into a predetermined shape in the same manner as the multi-layer-use substrate 430, however, this has no interlayer conductor portions.

Figure 35A:
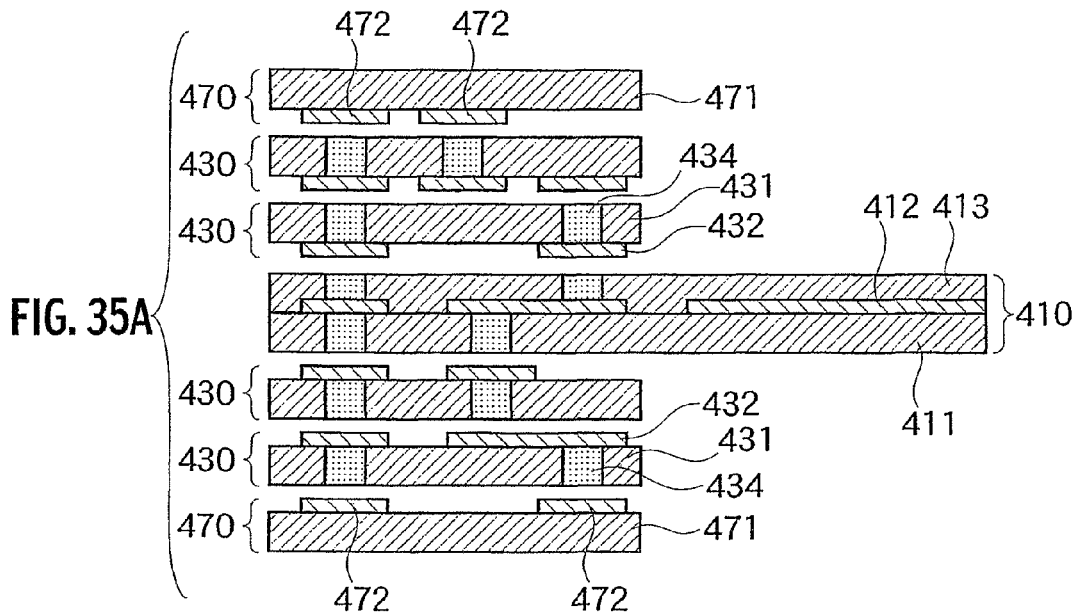
FIGS. 35A to 35C are flow charts that show laminating processes of the multi-layer writing substrate in which the partial multi-layer-forming substrate for use in an outer layer is used, in accordance with the fourth embodiment of the present invention.
Figure 35B:
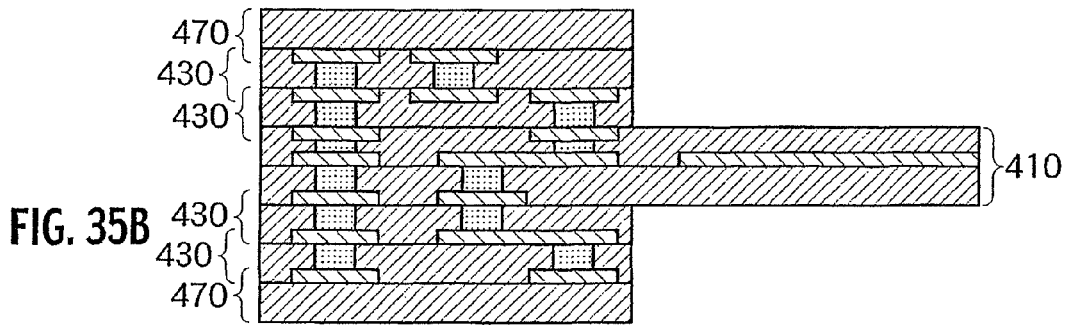

As shown in FIG. 35A, in place of the copper foil 437, the outer-layer-use wiring board for partial multi-layer 470 is placed and positioned on the surfaces 430A of the respective insulating base materials 431 on the upper side (surface side) and lower side (rear-surface side), with the conductor layer forming the wiring pattern and the component-packaging-use conductor land portions 472 being located on the surface 430A side of the insulating base material 431, and subjected to a colamination process as shown in FIG. 35B.

Figure 35C:
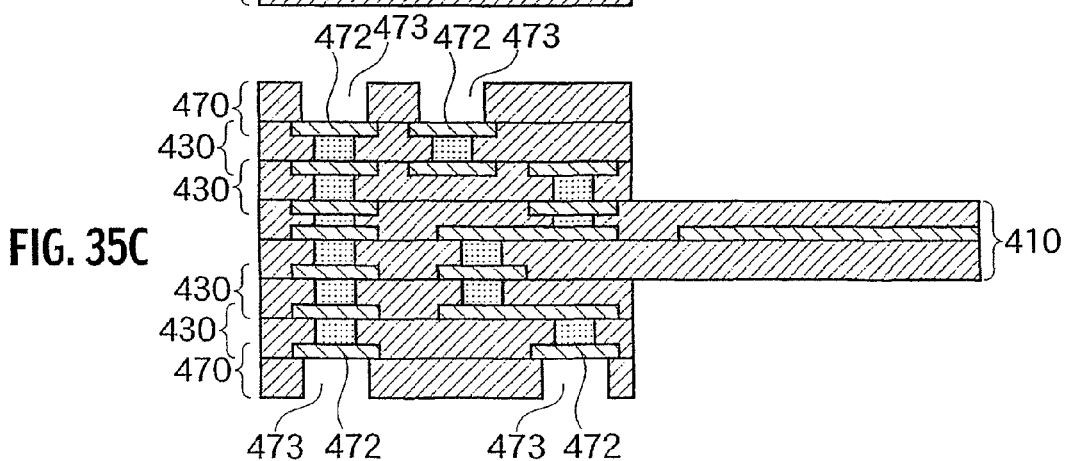

Thereafter, as shown in FIG. 35C, component-packaging-use contact holes 473, which penetrate the insulating base material 471 to be opened to communicate with the conductor land portion 472, are formed at predetermined positions of the surface and rear-surface respective outer-layer-use wiring board for partial multi-layers 470. Thus, a multi-layer wiring board having partial multi-layer portions 420A and 420B is completed.

The formation of the contact hole 473 is carried out by using an etching process in which only the insulating base material 471 is fused by etchant, with predetermined portions other than the contact-hole opening portions being protected by chemical resistant resist. Moreover, the contact holes 473 may be formed through a laser process using UV-YAG laser, carbon dioxide laser or the like.

In the present embodiment, since the conductor layer forming a wiring pattern on the surfaces of the partial multi-layer portions 420A and 420B is coated with the insulating base material 471, and therefore it is not necessary to separately prepare a cover layer for protecting the conductor layer forming the wiring pattern on the surfaces of the partial multi-layer portions 420A and 420B. Moreover, as shown in FIG. 33C, the component-packaging-use conductor land portions 472 are pushed into the insulating base material 431 of the wiring board for partial multi-layer 430 as shown in FIG. 33C. It is, therefore, possible to provide smooth surface layers of the partial multi-layer portions 420A and 420B.

Fourth Embodiment-Modified Embodiment

Figure 36:
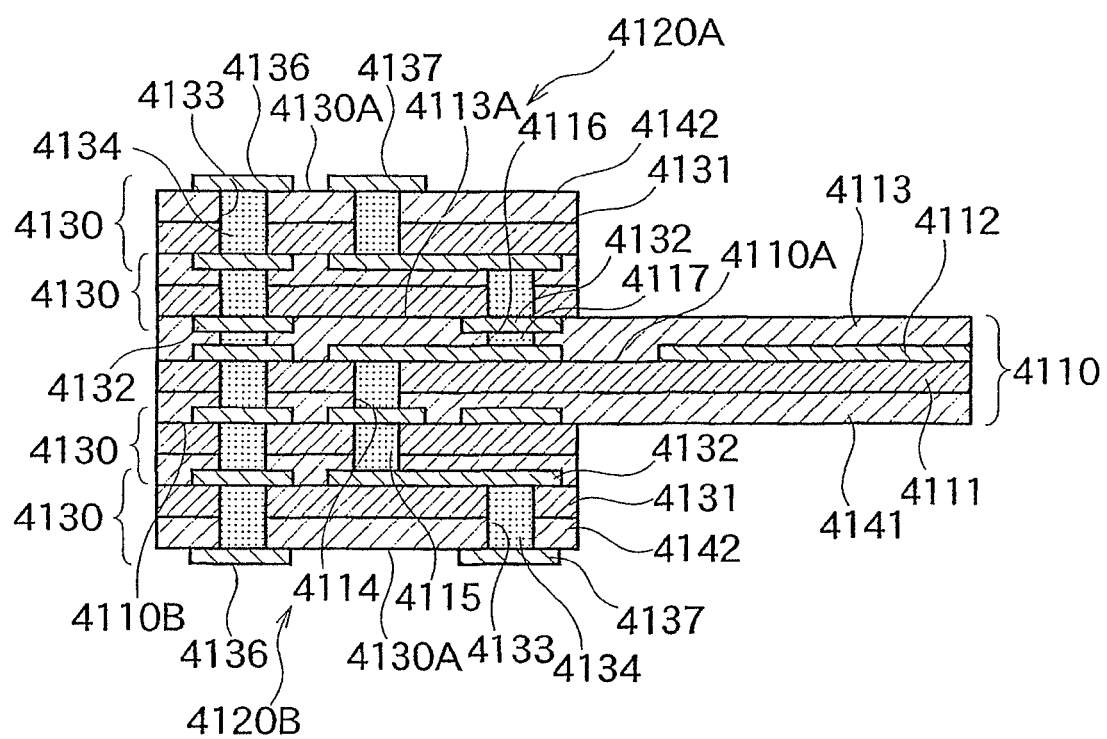
FIG. 36 is a cross-sectional view that shows a modified example of the multi-layer wiring board in accordance with the fourth embodiment of the present invention.

FIG. 36 shows another embodiment of a multi-layer wiring board in accordance with the present invention. This multi-layer wiring board is provided with a relay board 4110 such as a motherboard wiring board, and partial multi-layer portions 4120A and 4120B formed by respectively laminating partial multi-layer substrates 4130 at specific portions on both of the surface and rear-surface of the relay board 4110.

The relay board 4110 is comprised of a base material with single-sided wiring circuit that is provided with a conductor layer (including a conductor land portion) 4112 performing as a wiring pattern, which is formed on one surface (upper surface 4110A) of an insulating base material 4111 that is made from polyimide or the like. An interlayer bonding layer 4141 is formed on the other surface of the insulating base material 4111 so that the insulating layer is allowed to have a two-layer structure with the insulating base material 4111 and the interlayer bonding layer 4141. With respect to the material for the interlayer bonding layer 4141, thermosetting polyimide, thermoplastic polyimide, thermoplastic polyimide to which a thermosetting property is imparted, liquid crystal polymer, epoxy resin and the like can be used.

On the conductor layer surface (upper surface 4110A) forming the wiring pattern if the insulating board 4111, an insulating resin layer 4113, which also performs as an interlayer bonding layer, is formed. The insulating resin layer 4113 may be formed the same material as the material of the interlayer bonding layer 4141.

With respect to the relay board 4110, interlayer conductive portions 4115 and 4117 formed by via holes 4114 and 4116 are respectively formed in the insulating base material 4111, the interlayer bonding layer 4141 and the insulating resin layer 4113. The interlayer conductive portions 4115 and 4117 are constituted by the via holes 4114 and 4116 in which conductive paste is embedded and injected.

On the surface of the interlayer bonding layer 4141 on the side opposite to the insulating base material 4111, that is, the rear surface 4110B and the surface (upper surface 4113A) of the insulating resin layer 4113, wiring board for partial multi-layers 4130 having outer shapes that have been preliminarily formed into predetermined shapes are laminated in conductive-association with the conductor layer 4112 forming the wiring pattern of the relay board 4110 through the interlayer conductive portion 4115 or 4117.

In the same manner as the relay board 4110, the wiring board for partial multi-layer 4130 is also comprised of a base material with single-sided wiring circuit that is provided with a conductor layer (including a conductor land portion) 4132 forming a wiring pattern, which is formed on one surface of an insulating base material 4131. An adhesive layer 4142 is formed on the other surface of the insulating base material 4131. With respect to the wiring board for partial multi-layer 4130, an interlayer conductor portion 4134 is formed in the insulating base material 4131 and the adhesive layer 4142 through a via hole 4133. The interlayer conductive portion 4134 is also constituted by the via hole 4133 in which conductive paste is embedded and injected.

With respect to the wiring board for partial multi-layer 4130, on the upper surface 4113A side of the relay board 4110, that is, on the partial multi-layer portion 4120A, a plurality of them are laminated with the conductor layer 4132 forming a wiring pattern facing down, and on the rear-surface 4110B side of the relay board 4110, that is, on the partial Iti-1a er portion 4120B, a plurality of them are laminated with the conductor layer 4132 forming a wiring pattern facing up, thus, these layers are bonded by the adhesive layers 4141 and 4142 or the insulating resin layer 4113, which are located between layers. In other words, the wiring board for partial multi-layers 4130 are laminated on the upper side and the lower side of the relay board 4110 with the conductor layer 4132 side thereof forming a wiring pattern facing the relay board 4110 side.

On the surface 4130A of the adhesive layer 4142 of the wiring board for partial multi-layer 4130 that forms the outermost layer of each of the partial multi-layer portions 4120A and 4120B, a conductor layer 4135 forming a wiring pattern and a component-packaging-use conductor land portion 4136 are formed.

With the above-mentioned structure, even when a lamination material having a conductor layer such as copper foil formed on only one surface of the insulating base material 4111 is used as a starting material, a partial multi-layer structure is prepared at desired portions on both of the surface and rear surface of the relay board 4110, thereby allowing double-sided packaging processes. Moreover, by using the wiring board for partial multi-layer 4130 having an outer shape that has been preliminarily formed into a predetermined shape. It becomes possible to eliminate the necessity of preparing excessive multi-layer portions, and consequently to cut the number of processes and the material costs.

Figure 37A:
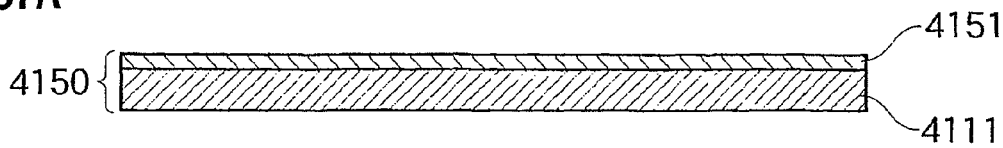
FIGS. 37A to 37E are flow charts that show manufacturing processes of a relay board to be used in the modified example of the multi-layer wiring board in accordance with the fourth embodiment of the present invention.
Figure 37B:
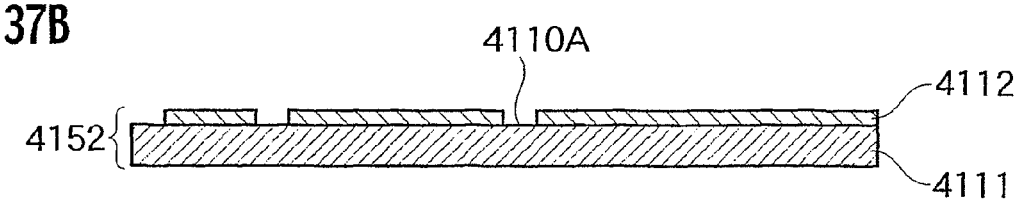
Figure 37C:
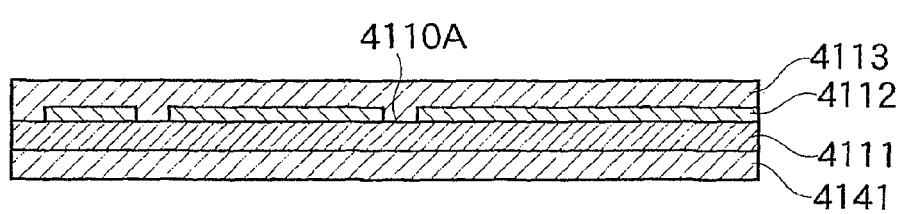
Figure 37D:
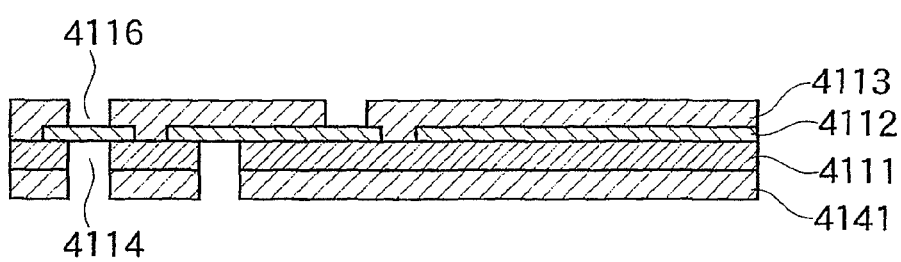
Figure 37E:
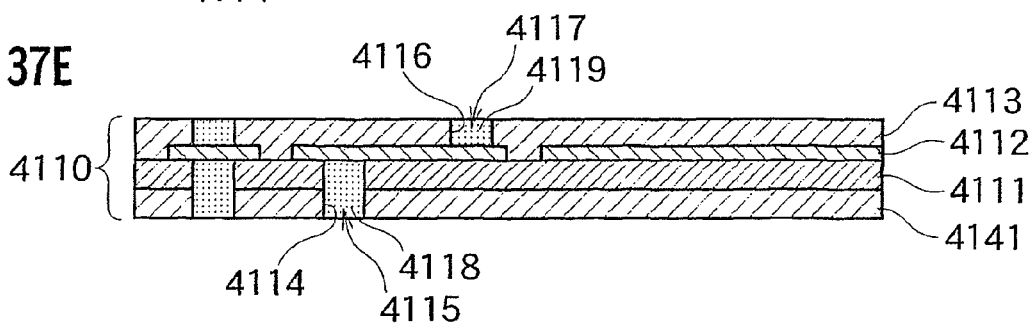
Figure 38:
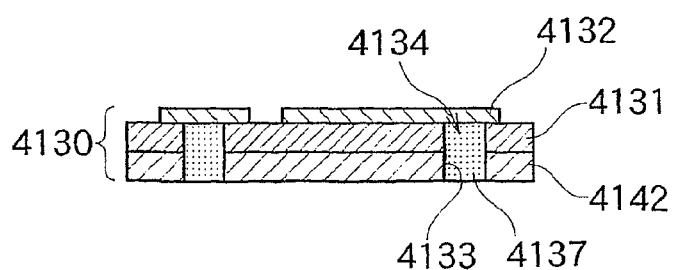
FIG. 38 is a cross-sectional view that shows a partial multi-layer-forming substrate to be used in the modified example of the multi-layer wiring board in accordance with the fourth embodiment of the present invention.
Figure 39A:
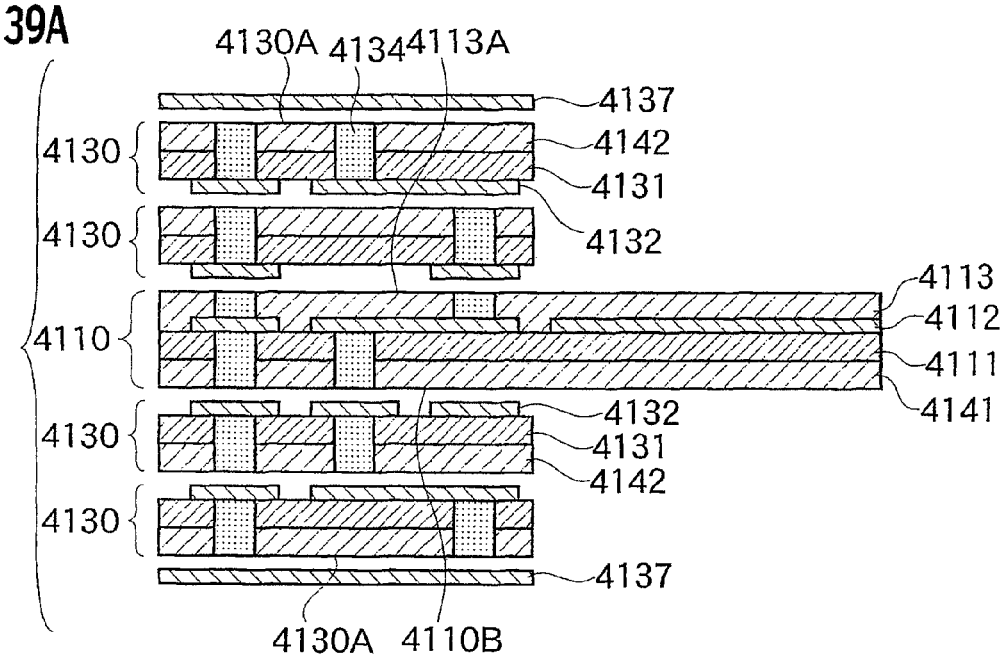
FIGS. 39A to 39C are flow charts that show laminating processes of a modified example of the multi-layer wiring board in accordance with the fourth embodiment of the present invention.
Figure 39B:
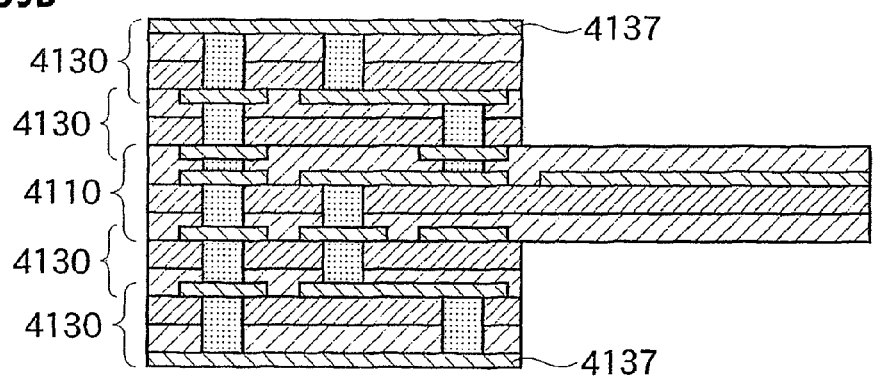
Figure 39C:
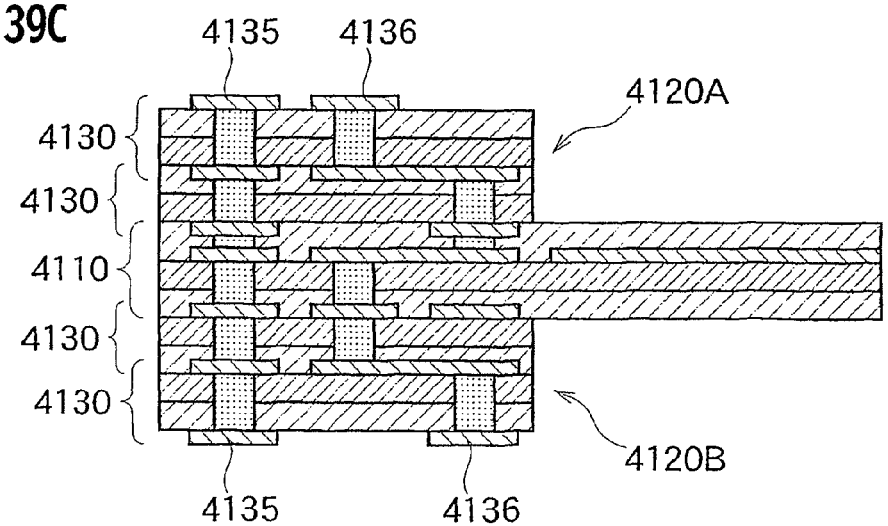

With reference to FIGS. 37 to 39, a manufacturing method for a multi-layer wiring board to be used for the above-mentioned modified embodiment of the present embodiment will be described below.

FIGS. 37A to 37E show manufacturing processes of a relay board 4110. As shown in FIG. 37A, a general-use single-sided copper coat polyimide base material (single-sided conductor coat lamination plate) 4150 is used as a starting material. The single-sided copper coat polyimide base material 4150 is a single-sided copper coat lamination plate (CCL) having copper foil 4151 placed as a conductor layer on only one of the surfaces of the insulating base material 4111 made of a polyimide film.

First, etching resist is laminated on the copper foil 4151 of the single-sided copper coat polyimide base material 4150, and this is subjected to exposure to form a wiring pattern thereon, and then developed. Thereafter, the exposed copper is etched through a cupric chloride bath to form a conductor layer (conductive pattern) 4112. Subsequently, the etching resist is removed so that a substrate with single-sided circuit 4152, shown in FIG. 37B, is formed.

As shown in FIG. 37C, on the surface of the insulating base material 4111 opposite to the conductor layer surface (upper surface 4110A) forming a wiring pattern, an interlayer bonding layer 4141 is formed, and on the conductor layer surface (upper surface 4110A) forming a wiring pattern of the insulating base material 4111, an insulating resin layer 4113 which also performs as an adhesive layer, is formed. The insulating resin layer 4113 may be formed by a thermoplastic polyimide or the like, thus, by using the film-shaped material, a layering process can be carried out on the upper surface 4110A of the insulating base material 4111 by using a contact-layering process, a laminating process or a vacuum laminating process through heat pressing or vacuum heat pressing. Moreover, the insulating resin layer 4113 may also be formed through a coating process such as a curtain coating process and a spin coating process by using a precursor varnish of a resin material.

Subsequently, as shown in FIG. 37D, a UV YAG laser beam a carbon dioxide laser beam or the like is applied to a desired position to be used for interlayer connection from the interlayer bonding layer 4141 side to form a via hole 4114 that penetrates the interlayer bonding layer 4141 and the insulating base material 4111 to contact the rear surface of copper foil (conductor layer 4112 forming a wiring pattern). Moreover, a UV-YAG laser beam, a carbon dioxide laser beam or the like is applied to a desired position to be used for interlayer connection from the insulating resin layer 4113 side to form a via hole 4116 that penetrates the insulating resin layer 4113 to contact the upper surface of copper foil (conductor layer 4112 forming a wiring pattern).

Subsequently; as shown in FIG. 37E, pieces of thermosetting silver paste 4118 and 4119 are embedded and injected into the via holes 4114 and 4116 through a print method or the like to form interlayer conductive portions 4115 and 4117. Thus, a relay board 4110 is formed.

In this modified embodiment also, with respect to the relay board 4110, since the conductive layer 4112 forming the wiring pattern, except for the interlayer conductive portions 4115 and 4117, is coated with the insulating resin layer 4113. It is possible to omit the process for placing the cover layer for protecting the conductor layer 4112 forming the wiring pattern.

FIG. 38 shows a wiring board for partial multi-layer 4130. The wiring board for partial multi-layer 4130 is formed by the following processes: A general-use single-sided copper coat polyimide base material that is the same as the starting material of the relay board 4110 is used as a starting material, a conductor layer 4132 forming a wiring pattern is formed through etching, a via hole 4133 is formed through a laser process or the like, and an interlayer conductive portion 4134 is formed by embedding and injecting silver paste 4137 in the via hole 4133.

As shown in FIG. 38, prior to the lamination process onto the relay board 4110, the wiring board for partial multi-layer 4130 is subjected to an outer-shape forming process (press punching process) and allowed to have a predetermined shape corresponding to the plane shape of the partial multi-layer portions 4120A and 4120B.

FIG. 39 shows lamination processes of the wiring board for partial multi-layer 4130 manufactured through the above-mentioned processes. As shown in FIG. 39A, predetermined numbers of wiring board for partial multi-layers 4130 having outer shapes that have been formed into predetermined shapes are respectively positioned at specific areas on the upper surface 4113A of the insulating resin layer 4113 and the rear surface 4110B of the insulating base material 4111 of the relay board 4110 by using alignment marks, reference holes, circuit patterns or the like (not shown), and then superposed one another. Further, upper-surface and rear-surface outermost-layer-use copper foils 4137 are respectively placed on the surfaces 4130A of the adhesive layer 4142 on the upper side (surface side) and the lower side (rear-surface side). Here, on the respective upper side and lower side of the relay board 4110, the wiring board for partial multi-layers 4130 are laminated with the conductive layer 4132 side forming a wiring pattern facing the relay board 4110 side.

Further, as shown in FIG. 39B, this is heated and contact-bonded under a high temperature and a high pressure by using a vacuum cure pressing machine or a cure pressing machine so that a batch multi-layer-forming process is carried out.

Lastly, the surface and rear-surface outermost-layer-use copper foils 4137 are respectively etched so that a conductor layer 4135 forming a wiring pattern and component-packaging-use conductor land portions 4136 are formed. Thus, a multi-layer wiring board having partial multi-layer portions 4120A and 4120B is completed.

In this modified embodiment also, the conductor layer 4135 forming the wiring pattern on the outermost layer and the component-packaging-use conductor land portions 4136 may be formed by using a circuit-forming transfer tape that is the same as the circuit-forming transfer tape 460 shown in FIGS. 32 and 33. Moreover, by using an outer-layer-use wiring board for partial multi-layer that is the same as the outer-layer-use wiring board for partial multi-layer 470 as shown in FIGS. 34 and 35, a structure in which component-packaging-use contact holes are formed in the outer-layer-use wiring board for partial multi-layer may be prepared.

INDUSTRIAL APPLICABILITY

In accordance with the present invention, at least one base material having a wiring circuit that has been preliminarily formed into a predetermined outer shape is bonded to a motherboard, and these are electrically connected to each other through at least an inner via hole. The outer shape of the base material having a wiring circuit is made smaller than the outer shape of the motherboard with the base material, having a wiring circuit having an island shape on the motherboard. Therefore, it becomes possible to provide a higher design freedom for wiring, and consequently to cut material costs and achieve a reduction in the substrate capacitance.

Moreover, in accordance with the present invention, at least one base material with single-sided wiring circuit that has been preliminarily formed into a predetermined outer shape is bonded to a motherboard, and these are electrically connected to each other at least one portion through an inner via hole. The outer shape of the base material with single-sided wiring circuit is made smaller than the outer shape of the motherboard with the base material, having a wiring circuit having an island shape on the motherboard. Therefore, it becomes possible to provide a higher design freedom for wiring, and consequently to cut material costs and achieve a reduction in the substrate capacitance.

Moreover, the base material with single-sided wiring circuit laminated on the motherboard is positioned so that an outer shape of a second base material bonded to the first base material is located inside the outer shape of the first base material on the motherboard side, and is allowed to have a pyramid shape, and therefore, upon bending the motherboard, stress imposed between the motherboard and the substrate with single-sided wiring circuit as well as between the laminated substrates with single-sided wiring circuit can be dispersed and alleviated. Therefore, it becomes possible to provide high anti-bending strength (peel strength), and consequently to achieve a good bending property that is a feature of the multi-layer flexible printed wiring board (FPC).

Moreover, in accordance with the present invention, at least one portion of the insulating base material of the main single-sided circuit substrate is partially removed, and the rear surface of a conductive pattern is exposed at the removed portion, and from the other side of the insulating base material of the main single-sided circuit substrate, an electronic part is assembled in a state in which it is conduction-connected to the rear-face exposed portion of the conductive pattern, and/or a single-sided circuit board for multi-layer wiring board having an interlayer conductive portion and a conductive pattern formed on one face of an insulating base material is laminated in a state in which it is conduction-connected to the rear-face exposed-portion of the conductive pattern. Moreover, on the other face of the insulating base material of the main single-sided circuit substrate also, an electronic part is assembled and/or a single-sided circuit board for multi-layer wiring board is laminated so that it is possible to provide a circuit substrate that allows double-sided packaging processes.

Furthermore, in accordance with the present invention, an insulating resin layer, which also serves as an adhesive layer, is formed on the conductor layer surface side of a relay board, and an interlayer conductive portion derived from a conductive substance injected into a via hole formed in an insulating base material and an interlayer conductive portion derived from a conductive substance injected into a via hole formed in the insulating resin layer are prepared; therefore, even when a lamination material having a conductive layer such as copper foil only on one surface of the insulating base material is used as a starting material, it is possible to partially prepare a multi-layer structure at a desired portion on both of the surface and rear surface of the relay board, and consequently to allow double-sided packaging processes.

The invention claimed is:

1. A method for manufacturing a multi-layer wiring board comprising the steps of:

preparing a resin plate to be used for a base material with single-sided wiring circuit;

forming a circuit portion on one surface of the resin plate;

making via holes that penetrate the resin plate from the one surface to the other surface to reach at least one portion of the circuit portion formed on the one surface of resin plate;

injecting conductive paste into the via holes;

provisionally curing the conductive paste;

dividing the base material with single-sided wiring circuit being formed by previous steps into a plurality of base materials with single-sided wiring circuits, each of the plurality of base materials having a different size and at least one of the via holes;

positioning the base materials with single-sided wiring circuits on a motherboard to be placed thereon such that each of the plurality of base materials is in direct contact with the motherboard; and laminating the base materials with single-sided wiring circuits and the motherboard through a colaminating process while heating the base materials and the motherboard so that a main curing process on the conductive paste is performed.

2. The method according to claim 1, wherein in the laminating step the plurality of base materials are laminated on the motherboard in descending order of size.

3. The method according to claim 2, wherein in the laminating step the plurality of base materials are not laminated on opposite regions of opposing surfaces of the motherboard, respectively.

4. The method according to claim 1, further comprising the steps of:
   coating the motherboard with a cover layer on portions of the motherboard not laminated with the base materials; and
   forming an opening portion between the base materials and the cover layer.

5. The method according to claim 4, further comprising the step of:
   coating an exposed portion of the opening portion with a coating material.

6. The method according to claim 5, wherein the coating material is one of a noble metal and a solder resist.

7. The method according to claim 1, wherein an outer shape of each of the plurality of base materials is smaller than an outer shape of the motherboard.

8. The method according to claim 1, wherein the motherboard comprises an insulating material and conductor layers formed on a front surface and a rear surface of the insulating material.

9. The method according to claim 1, wherein each of the plurality of base materials comprises a plurality of insulation layers and a plurality of conductor layers.

10. The method according to claim 1, wherein the positioning the base materials with single-sided wiring circuits on the motherboard comprises positioning the base materials such that none of the base materials are in direct contact with each other.

* * * * *